(12) United States Patent
Inamasu et al.

(10) Patent No.: US 8,307,778 B2
(45) Date of Patent: Nov. 13, 2012

(54) COATING METHOD AND COATING UNIT

(75) Inventors: Toshifumi Inamasu, Koshi (JP); Fumihiko Ikeda, Koshi (JP); Kenya Shinozaki, Koshi (JP); Yoshitaka Otsuka, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 798 days.

(21) Appl. No.: 12/375,267

(22) PCT Filed: Jul. 5, 2007

(86) PCT No.: PCT/JP2007/063441

§ 371 (c)(1),
(2), (4) Date: Mar. 24, 2009

(87) PCT Pub. No.: WO2008/013035

PCT Pub. Date: Jan. 31, 2008

(65) Prior Publication Data

US 2009/0311434 A1   Dec. 17, 2009

(30) Foreign Application Priority Data

Jul. 27, 2006   (JP) ................................. 2006-205053

(51) Int. Cl.
*B05C 5/02* (2006.01)

(52) U.S. Cl. ......................... 118/300; 118/305; 118/500

(58) Field of Classification Search .................. 118/300, 118/305, 500; 198/689.1, 493, 817; 34/640, 34/658; 414/676; 269/21; 406/86, 88; 271/194–196

See application file for complete search history.

(56) References Cited

U.S. PATENT DOCUMENTS

| | | | | |
|---|---|---|---|---|
| 4,275,983 A | * | 6/1981 | Bergman | 414/676 |
| 6,139,639 A | * | 10/2000 | Kitamura et al. | 118/680 |
| 6,781,684 B1 | * | 8/2004 | Ekhoff | 356/237.1 |
| 7,604,439 B2 | * | 10/2009 | Yassour et al. | 406/88 |
| 7,648,579 B2 | * | 1/2010 | Goodman et al. | 118/730 |
| 2005/0015170 A1 | * | 1/2005 | Adin et al. | 700/110 |

FOREIGN PATENT DOCUMENTS

| | | |
|---|---|---|
| JP | 47 36388 | 11/1972 |
| JP | 2 115069 | 4/1990 |
| JP | 2002 261145 | 9/2002 |
| JP | 2005 244155 | 9/2005 |

\* cited by examiner

*Primary Examiner* — Laura Edwards
(74) *Attorney, Agent, or Firm* — Oblon, Spivak, McClelland, Maier & Neustadt, L.L.P.

(57) ABSTRACT

Jet lines $C_1, C_3, C_5, \ldots$ extending in an X-direction and suction lines $C_2, C_4, C_6, \ldots$ extending in the X-direction are arranged alternately at a fixed pitch W in a Y-direction. Jet openings 88 are arranged at fixed intervals 3D on the jet lines $C_{2n-1}$, suction openings 90 are arranged at fixed intervals 3D on the suction lines $C_{2n}$, and the jet openings 88 and the suction openings 90 on the adjacent ones of the jet lines $C_{2n-1}$ and the suction lines $C_{2n}$ are spaced apart from each other by a fixed distance D with respect to the X-direction. Slots 88a and 90a are extended straight from the upper ends of the jet openings 88 and the upper ends of the suction openings 90, respectively, in a carrying direction (the X-direction) and a direction opposite the carrying direction.

20 Claims, 23 Drawing Sheets

COATING METHOD AND COATING UNIT

TECHNICAL FIELD

The present invention relates to a coating method and a coating unit for coating a substrate with a coating solution film while the substrate is being carried by a flotation-carrying system.

BACKGROUND ART

A spinless coating method is used prevalently by a photolithographic process included in manufacturing processes for manufacturing a flat panel display (FPD), such as a LCD. The spinless coating method pours a resist solution onto a substrate, such as a glass substrate, through a discharge opening having the shape of a slit and formed in a long resist discharge nozzle while the resist discharge nozzle is moved along the surface of the substrate.

A spinless coating method disclosed in Patent document 1 carries a substrate by a flotation-carrying system using a flotation-carrying stage that carries the substrate floating above the flotation-carrying stage in a horizontal direction parallel to the length of the flotation-carrying stage. A long resist discharge nozzle disposed at a predetermined position above a middle part of the flotation-carrying stage discharges a resist solution in a band onto the substrate moving under the resist discharge nozzle to coat the substrate entirely with the resist solution.

The flotation-carrying stage of the flotation-carrying system is provided with many jet openings in the entire upper surface of the flotation-carrying stage in a predetermined density, and many suction openings in a predetermined coating area extending on the front and the rear side of a position directly below the resist discharge nozzle in a predetermined density. A high-pressure or positive-pressure gas, such as air, is jetted through the jet openings to make the substrate float above the flotation-carrying stage. Air is sucked by suction through the suction openings. The balance of a pressure applied vertically upward by the air jetted through the jet openings and a pressure applied vertically downward by the air sucked through the suction openings is controlled to apply a precise flotation pressure to the substrate. Usually, both the jet openings and the suction openings are round openings. The jet openings and the suction openings are arranged at fixed intervals along a carrying direction, namely, an X-direction, and a horizontal direction, namely, a Y-direction, in a lattice or a matrix.

The flotation-carrying system, as compared with a moving-nozzle system that holds a substrate fixedly, moves a long resist solution discharge nozzle horizontally over the substrate and discharges a resist solution in a band to coat the surface of the substrate entirely with the resist solution, is advantageous in coating a large substrate with a resist solution using a large, long resist solution discharge nozzle.

Patent document 1: JP 2005-244155 A

DISCLOSURE OF THE INVENTION

Problem to be Solved by the Invention

In a coating unit using the flotation-carrying system, an upward pressure applied to the substrate by air jetted through the jet openings changes sharply when the front end of the substrate moving over the coating area covers the jet openings substantially completely or a downward pressure applied to the substrate by air sucked through the suction openings when the front end of the substrate moving over the coating area covers the suction openings substantially completely to cause the substrate vibrate vertically. Similarly, an upward pressure applied to the substrate by air jetted through the jet openings changes sharply when the rear end of the substrate moved past the coating area uncovers the jet openings substantially completely or a downward pressure applied to the substrate by air sucked through the suction openings when the rear end of the substrate moved past the coating area uncovers the suction openings substantially completely to cause the substrate vibrate vertically. Consequently, a plurality of lines are formed at fixed intervals in the moving direction in opposite end parts of a resist film formed on the substrate, namely, parts of the resist film coating a front end and a rear end part of the substrate, in a banded pattern; that is, the opposite end parts are coated irregularly with the banded parts of the resist film.

In such banded irregularities, lines nearer to the front or the rear end of the substrate are thicker and lines nearer to the middle of the substrate are thinner. The pitches of the lines of the banded irregularities are proportional to those of the jet openings and suction openings with respect to the carrying direction. Therefore, the smaller the pitches of the jet and the suction openings, the nearer the banded irregularities to the front and the rear end, respectively. However, the banded irregularities cannot be made to vanish completely and the deterioration of the thickness quality of the resist film remains unchanged.

The present invention has been made in view of the foregoing problems in the prior art and it is therefore an object of the present invention to provide a coating method and a coating unit capable of effectively reducing or suppressing the formation of banded irregularities in a coating solution film formed on a substrate by a flotation-carrying system and of improving the thickness quality of a coating film.

Means for Solving the Problem

The present invention provides a coating unit including: a stage having a first flotation area provided with many jet openings for jetting a gas and many suction openings for sucking the gas in an intermixed arrangement; substrate carrying mechanisms capable of moving a substrate floating above the stage in a predetermined carrying direction past the first flotation area; a process liquid supply unit including a nozzle disposed above the first flotation area and capable of making the nozzle discharge the process liquid onto the substrate; and slots formed in the first flotation area in the upper surface of the stage so as to extend in a first direction parallel to or inclined at an acute angle to the carrying direction from the upper ends of the jet openings or the suction openings.

The present invention provides a coating method including: arranging a receiving area of a size greater than that of a substrate, a coating area of a size smaller than that of the substrate and a delivery area of a size greater than that of the substrate in that order in a line in a carrying direction on a stage; making a substrate float by the pressure of a gas jetted through many jet openings formed in the upper surface of the stage; forming many suction openings intermixed with the jet openings in the upper surface of the state at least in the coating area; controlling the balance of a pressure applied vertically upward by the gas jetted through the jet openings and a pressure applied vertically downward by the gas sucked through the suction openings to apply a desired flotation pressure to the substrate while the substrate is passing the coating area; and coating the substrate with a process liquid by discharging the process liquid through a nozzle disposed above the coating area while the substrate is being carried from the receiving area to the delivery area; wherein slots are formed in the upper surface of the stage so as to extend parallel to or at an acute angle to the carrying direction from the upper ends of either of the jet openings and the suction openings.

While the substrate floating above the stage is being carried in a flotation carrying mode past the first flotation area, namely, the coating area, air shocks that act on the substrate upon the covering of the jet openings or the suction openings by the front end of the substrate and air shocks that act on the substrate upon the uncovering of the jet openings or the suction openings by the rear end of the substrate are moderated by the pressure dispersing function of the slots connecting to the jet openings or the suction openings, so that formation of banded irregularities can be suppressed.

Preferably, both slots extending in the carrying direction from the upper ends of the jet or the suction openings and slots extending in a direction opposite the carrying direction from the upper ends of the jet or the suction openings are formed. If slots are formed only on one side of the jet or the suction openings, it is preferable that the slots are extended in the direction opposite the carrying direction from the upper ends of the jet or the suction openings on the upstream side of the discharge opening of the nozzle and the slots are extended in the carrying direction from the upper ends of the jet or the suction openings on the downstream side of the discharge opening of the nozzle.

Although it is preferable to extend slots from all the jet openings and all the suction openings to stabilize the substrate at a floating height in the first flotation area, there may be some jet or suction openings from which slots are not extended in the first flotation area in consideration of other conditions.

In a preferred mode of the present invention, the slot connecting to the jet or the suction opening extend in a first direction beyond the adjacent jet or suction opening. When each of the slots are thus formed, the slot reduces not only air shocks at the jet or the suction openings from which the slot extends by the pressure dispersing function, but also can absorb and reduce air shocks at the adjacent jet or the suction opening.

The depth and width (thickness) representing the profile of the slot may be optionally determined. Preferably, the slot has the greatest depth at the upper end of the jet or the suction opening and has a bottom sloping up from the upper end of the jet or the suction opening toward the free end thereof.

The jet and the suction openings are arranged in a pattern such that the jet openings are arranged at first intervals on straight jet lines extending in a first direction and arranged at first pitches in a second direction perpendicular to the first direction, the suction openings are arranged at second intervals on straight suction lines extending in the first direction and arranged at second pitches in a second direction and the jet lines and the suction lines are separated from each other. Since the jet lines and the suction lines are parallel and are arranged alternately, the slots extending from the jet openings in the jet line overlap the suction openings of the adjacent suction lines with respect to the second direction, and the slots extending from the suction openings on the suction line overlap the jet openings of the adjacent jet lines with respect to the second direction.

In a preferred mode of the present invention, the jet and the suction openings are arranged alternately at first intervals on straight jet-and-suction lines extending in a first direction, and the jet-and-suction lines are arranged at second intervals in a second direction perpendicular to the first direction.

In a preferred mode of the present invention, the jet and the suction openings are arranged in a pattern such that the number of the jet or the suction openings on an optional straight line extending on the stage in the second direction perpendicular to the first direction is smaller than that of the jet or the suction openings arranged in a line in the second direction perpendicular to the first direction, preferably, half the number of the jet or the suction openings arranged in a line in the second direction perpendicular to the first direction or less. When the jet and the suction openings are arranged in this pattern, the number of the jet or the suction openings simultaneously covered by the front end of the substrate being floated and carried and the number of the jet or the suction openings simultaneously uncovered by the rear end of the substrate being floated and carried can be reduced without reducing the respective densities of the jet and the suction openings.

In a preferred mode of the present invention, the substrate is rectangular. The substrate carrying mechanism carries the substrate above the stage such that one of the pairs of sides of the substrate is parallel to the carrying direction and the other pair of sides of the substrate is perpendicular to the carrying direction.

In a preferred mode of the present invention, the coating unit is provided with a flotation pressure controller for controlling at least either of the pressure of the gas jetted through the jet openings and the vacuum in the suction openings for the variable height control of the floating height of the substrate at a position directly below the discharge opening of the nozzle. The coating unit is provided with a nozzle lifting mechanism for vertically moving the nozzle.

A coating method according to the present invention includes: arranging a receiving area of a size greater than that of a substrate, a coating area of a size smaller than that of the substrate and a delivery area of a size greater than that of the substrate in that order in a line in a carrying direction on a stage; floating a substrate by the pressure of a gas jetted through many jet openings formed in the upper surface of the stage; forming many suction openings intermixed with the jet openings in the upper surface of the stage at least in the coating area; controlling the balance of pressure applied vertically upward by the gas jetted through the jet openings and pressure applied vertically downward by the gas sucked through the suction openings to apply a desired flotation pressure to the substrate while the substrate is moving through the coating area; and coating the substrate with a process liquid by discharging the process liquid through a nozzle disposed above the coating area while the substrate is being carried from the receiving area to the delivery area; wherein the slots are formed in the upper surface of the stage so as to extend parallel to or at an acute angle to the carrying direction from the upper ends of either of the jet and the suction openings.

A coating method in a preferred mode of the present invention includes the steps of: holding a flotation pressure acting on a substrate nearly equal to a first set pressure in a first period before the front end of the substrate arrives at a reference position directly below the discharge opening of the nozzle; increasing the flotation pressure acting on the substrate from the first set pressure to a second set pressure higher than the first set pressure in a predetermined waveform in a second period in which the front end of the substrate moves from the reference position by a first distance downstream in the carrying direction; holding the flotation pressure acting on the substrate nearly equal to the second set pressure in a third period from the termination of the second period to a moment when the rear end of the substrate passes a position at a second distance upstream from the reference position; and decreasing the flotation pressure acting on the substrate and nearly equal to the second set pressure to a lower third set pressure in a fourth period from the termination of the third period to a moment when the rear end of the substrate passes the reference position. This mode of controlling the flotation pressure moderates the variation of the thickness of the coating film in a front and a rear end part of the substrate.

A coating method in another preferred mode of the present invention includes the steps of: holding the discharge opening of the nozzle at a first level with respect to the stage in a first period before the front end of the substrate arrives at a reference position directly below the discharge opening of the nozzle; lowering the discharge opening of the nozzle to a second level lower than the first level in a predetermined waveform in a second period in which the front end of the substrate moves from the reference position by a first distance; holding the discharge opening of the nozzle at a level nearly equal to the second level in a third period from the termination of the second period to a moment when the rear end of the substrate passes a position at a second distance upstream from the reference position; and raising the discharge opening of the nozzle from the level nearly equal to the second level to a third level higher than the second level in a predetermined waveform in a fourth period from the termination of the third period to a moment when the rear end of the substrate passes the reference position. This mode of controlling the level of the nozzle moderates the variation of the thickness of the coating film in a front and a rear end part of the substrate.

The coating method or the coating unit of the present invention can improve the thickness of the film of the process liquid by effectively reducing banded irregularities in the film of the process liquid formed on the substrate being carried by the flotation-carrying system.

BEST MODE FOR CARRYING OUT THE INVENTION

Preferred embodiments of the present invention will be described with reference to the accompanying drawings.

Figure 1:
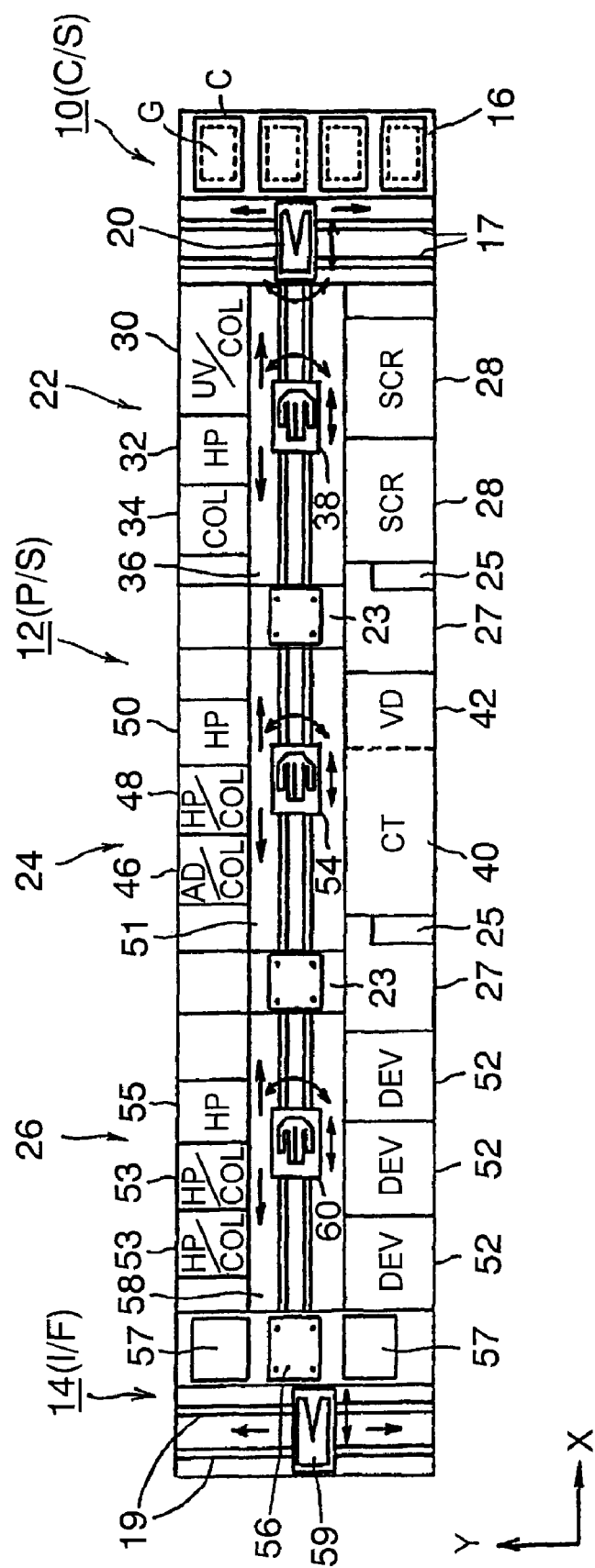
FIG. 1 is a plan view of a coating and developing system to which the present invention is applicable.

FIG. 1 shows a coating and developing system to which a coating method and a coating unit of the present invention is applicable. The coating and developing system is installed in a cleanroom and carries out a cleaning process, a resist application process, a prebaking process, a developing process and a postbaking process included in photolithography included in a LCD manufacturing process to process rectangular glass substrates as workpieces for forming LCDs. An exposure process is carried out by an external exposure system, not shown, installed near the coating and developing system.

The coating and developing system has, as principal components, a cassette station (C/S) 10, a processing station (P/S) 12 and an interface station (I/F) 14

The cassette station (C/S) 10 is at one end of the coating and developing system. The cassette station (C/S) 10 includes a cassette stage 16 capable of supporting a predetermined number of cassettes C each containing a plurality of substrates G, such as four cassettes C, guide rails 17 extended parallel to a cassette arranging direction beside the cassette stage 16, and a carrying mechanism 20 capable of moving along the guide rails 17 and of taking out a substrate G from and putting a substrate G into the cassette C placed on the cassette stage 16. The carrying mechanism 20 has a holding means for holding a substrate G, such as a carrying arm. The carrying arm can move along the X-axis, the Y-axis and the Z-axis, and can turn about the θ-axis. A substrate G can be transferred between the carrying mechanism 20 and a carrying device 38 included in the processing station (P/S) 12

The processing station (P/S) 12 includes a cleaning block 22, a coating block 24 and a developing block 26, namely, processing blocks, arranged in a line in that order from the cassette station (C/S) 10 toward the interface unit (I/F) 14. A chemical solution supply unit 25 and a space 27 are interposed between the cleaning block 22 and the coating block 24, and a chemical solution supply unit 25 and a space 27 are interposed between the processing block 24 and the developing block 26.

The cleaning block 22 includes two scrub cleaning units (SCR) 28, two ultraviolet-irradiating and cooling units (UV/COL) 39 stacked in two layers, a heating unit (HP) 32 and a cooling unit (COL) 34.

The coating block 24 includes a spinless type coating unit (CT) 40, a vacuum drying unit (VD) 42, adhesion/cooling units (AD/COL) 46 stacked in two layers, heating/cooling units (HP/COL) 48 stacked in two layers, and a heating unit (HP) 50.

The developing block 26 includes three developing units (DEV) 52, two heating/cooling units (HP/COL) 53 stacked in two layers and a heating unit (HP) 55.

Longitudinal carrying passages 36, 51 and 58 are formed in respective central parts of the processing blocks 22, 24 and 26, respectively. Carrying devices move along the carrying passages 36, 51 and 58, respectively, access the units of those blocks to carry substrates G into and out of those units and carry substrates G. In the processing blocks 22, 24 and 26 of the coating and developing system, wet-processing units SCR, CT and DEV are arranged on one side of the carrying passages 36, 51 and 58, and heat-processing units HP and COL are arranged on the other side of the carrying passages 36, 51 and 58.

The interface block (I/F) 14 disposed at the other end of the coating and developing system includes an extension unit (substrate transfer unit) 56 and a buffer stage 57 disposed on the side of the processing block 12, and a carrying mechanism 59 disposed on the side of the exposure system. The carrying mechanism 59 moves along guide rails 19 parallel to the Y-axis. The carrying mechanism 59 carries a substrate G to and from the buffer stage 57, and transfers a substrate G to and receive a substrate G from the extension unit (substrate transfer unit) 56 and the exposure system adjacent to the interface block 14.

Figure 2:
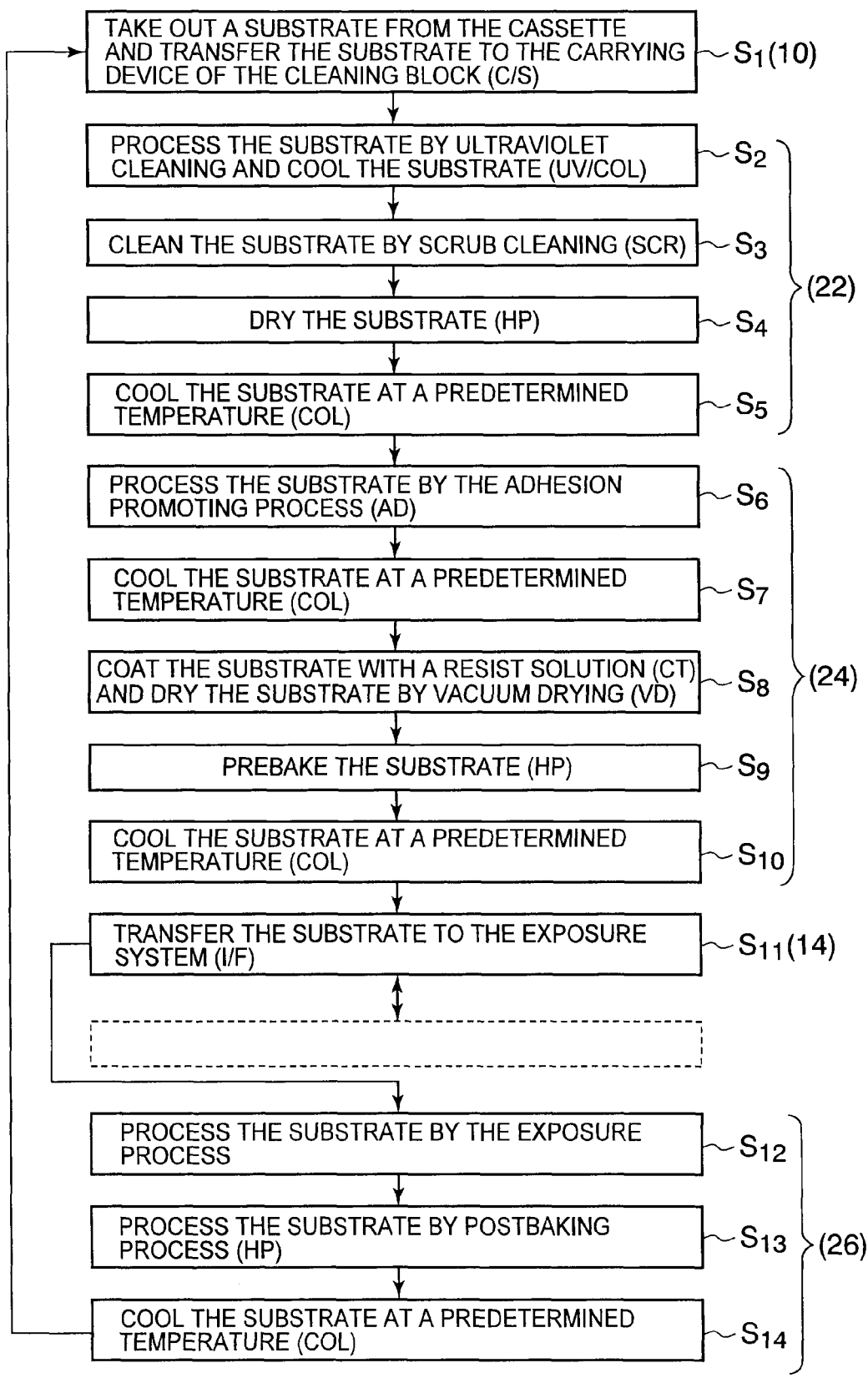
FIG. 2 is a flow chart of a processing procedure to be carried out by the coating and developing system.

FIG. 2 shows a processing procedure to be carried out by the coating and developing system. In the cassette station (C/S) 10, the carrying mechanism 20 takes out one substrate G from a cassette C placed on the cassette stage 16 and transfers the substrate G to the carrying device 38 of the cleaning block 22 of the processing station (P/S) 12 (step S1).

The substrate G is carried into the ultraviolet-irradiating/cooling unit (UV/COL) 30 of the cleaning block 22. An ultraviolet-irradiating unit (UV) irradiates the substrate G for dry cleaning and a cooling unit (COL) cools the substrate G at a predetermined temperature (step S2). Ultraviolet cleaning removes mainly organic matters sticking to the surface of the substrate G Subsequently, the substrate B is subjected to scrub cleaning by one of the scrub cleaning units (SCR) 28 to remove granular contaminants from the surface of the substrate (step S3). The substrate B cleaned by scrub cleaning is heated by the heating unit (HP) 32 for drying (step S4). Then, the substrate G is cooled at a predetermined temperature by the cooling unit (COL) 34 (step S5). Thus, a pretreatment to be executed by the cleaning block 22 is completed.

Then, the carrying device 38 carries the substrate G through a substrate transfer unit 23 to the coating block 24.

In the coating block 24, the substrate G is carried into the adhesion/cooling unit (AD/COL) 46. First, the substrate G is subjected to an adhesion promoting process (HMDS) by an adhesion promoting unit (AD) (step S6), and then the substrate G is cooled at a predetermined temperature by a cooling unit (COL) (step S7).

Then, the substrate G is coated with a resist solution by a spinless coating method by the coating unit (CT) 40 and is subjected to a drying process by the vacuum drying unit (VD) 42 (step S8).

Then, the substrate G is carried into the heating/cooling unit (HP/COL) 48. The first heating unit (HP) heats the substrate G for baking (prebaking) (step S9) and the cooling unit (COL) cools the substrate G at a predetermined temperature (step S10). The heating unit (HP) 50 may be used for the baking process following the coating process.

After the coating process, the substrate G is carried to the interface station (I/F) 14 by a carrying device 54 placed in the coating block 24 and the carrying device 60 of the developing block 26. Then, the substrate G is transferred from the interface station (I/F) 14 to the exposure system (step S11). The exposure system executes an exposure process to expose the resist film formed on the substrate G in a predetermined circuit pattern. The substrate G processed by the exposure process is returned from the exposure system to the interface station (I/F) 14. The carrying mechanism 59 of the interface station (I/F) 14 transfers the substrate G received from the exposure system through the extension unit 56 to the developing block 26 of the processing station (P/S) (step S11).

In the developing block 26, the substrate G is subjected to a developing process by one of the developing units (DEV) 52 (step S12). Then, the substrate G is carried to the heating/cooling unit (HP/COL) 53. The first heating unit (HP) processes the substrate G by a postbaking process (step S13), and then the cooling unit (COL) cools the substrate G at a predetermined temperature (step S14). The heating unit (HP) 55 may be used for the postbaking process.

After the substrate G has been processed by a series of processes by the developing block 26, the substrate G is carried by the carrying devices 60, 54 and 38 of the processing station (P/S) 12 to the cassette station (C/S) 10. then, the carrying mechanism 20 puts the substrate G into one of the cassettes C (step S1).

Figure 3:
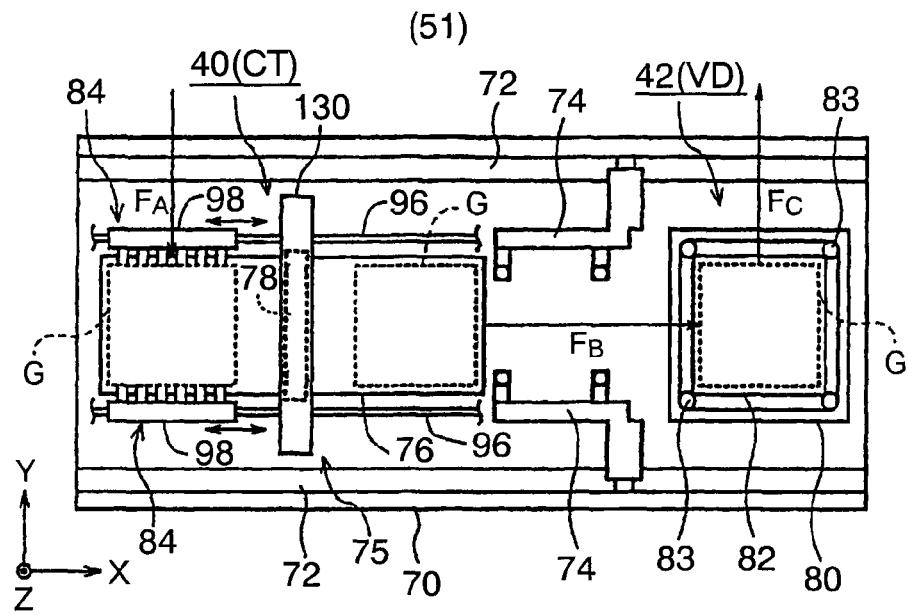
FIG. 3 is a schematic plan view of a coating unit and a vacuum drying unit included in the coating and developing system.

The present invention is applicable to, for example, the coating unit (CT) 40 of the coating block 24. FIG. 3 shows a coating unit (CT) 40 in a preferred embodiment according to the present invention and the vacuum drying unit (VD) 42.

Referring to FIG. 3, the coating unit (CT) 40 and the vacuum drying unit (VD) 42 are arranged in a X-direction in a line on a support table or a support frame 70. A new substrate G to be subjected to the coating process is carried in the direction of the arrow $F_A$ by the carrying device 54 (FIG. 1) on the carrying passage 51 into the coating unit (CT) 40. The substrate G processed by the coating process by the coating unit (CT) 40 is carried in the X-direction by carrying arms 74 movable along guide rails 72 in the direction of the arrow $F_B$ to the vacuum drying unit (VD) 42. The substrate G processed by the drying process by the vacuum drying unit (VD) 42 is received by the carrying device 54 (FIG. 1) on the carrying passage 51 as indicated by the arrow $F_C$.

The coating unit (CT) 40 has a stage 76 having longer sides extending in the X-direction. While a substrate G held in a horizontal position above the stage 76 is carried in the X-direction, a resist solution is discharged by an elongate resist solution discharge nozzle 78 to coat the upper surface, namely, a surface to be worked, of the substrate G with a resist film of a predetermined thickness by a spinless method. The construction and actions of parts of the coating unit (CT) 40 will be described later.

The vacuum drying unit (VD) 42 has an upper chamber 80 having the shape of a tray or a shallow vessel having an open upper end, and an upper chamber, not shown, having the shape of a cover closely joined to or fitted in the upper end of the upper chamber 80 in an airtight fashion. The lower chamber 80 is substantially square. A stage 82 for supporting a substrate G thereon is disposed in a central part of the lower chamber 80. Discharge holes 83 are formed in the four corners of the bottom of the lower chamber 80. The discharge openings are connected to a vacuum pump, not shown, by discharge pipes, not shown. The lower chamber 80 is covered with the upper chamber to define a closed processing space, and the processing space is evacuated at a predetermined vacuum by the vacuum pump.

Figure 4:
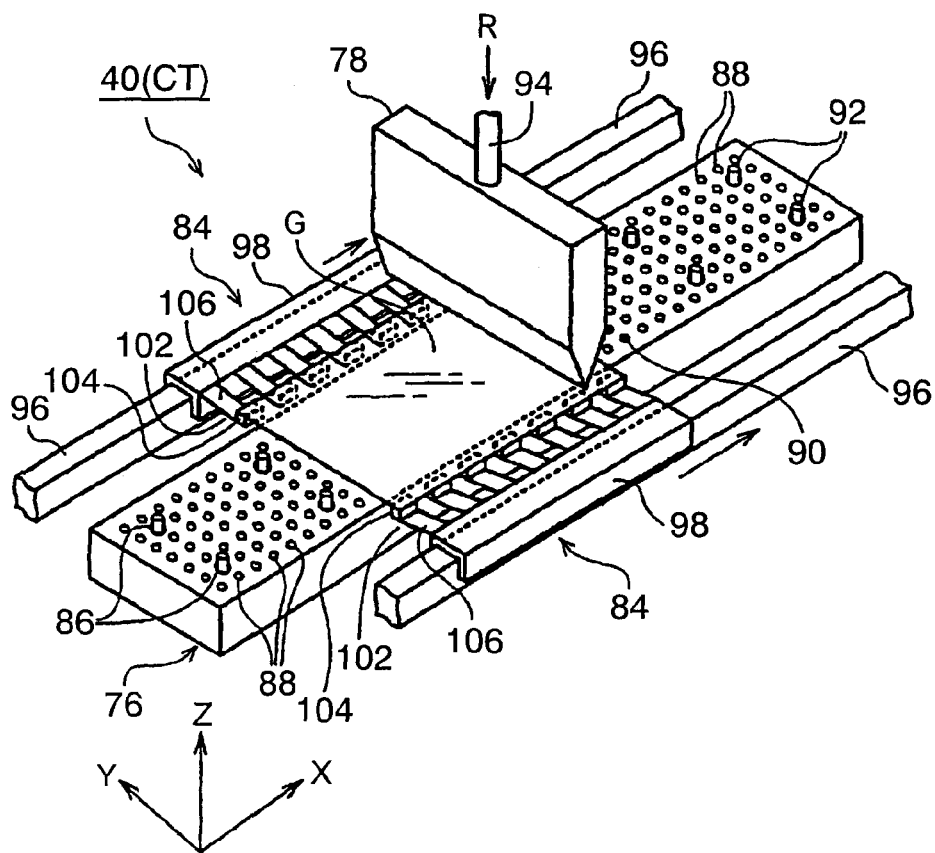
FIG. 4 is a perspective view of the coating unit.
Figure 5:
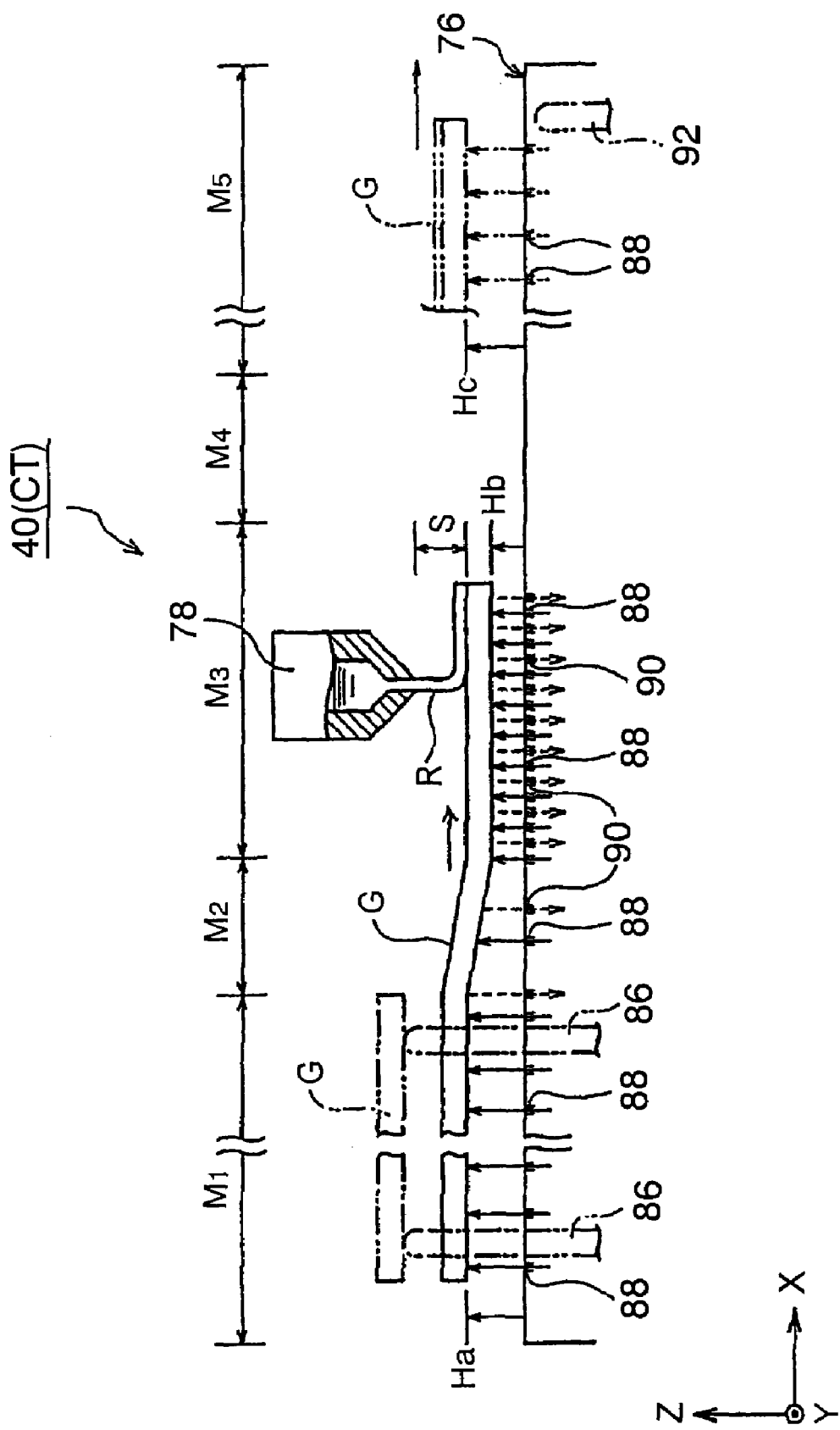
FIG. 5 is a schematic front elevation of the coating unit.

FIGS. 4 and 5 show the internal construction of the coating unit (CT) 40 of the embodiment of the present invention in detail.

In the coating unit (CT) 40 of this embodiment, the stage 76 does not hold a substrate G fixedly line a stage of a moving nozzle type coating unit. The stage 76 is a flotation stage for floating a substrate G on air by air pressure. Linear substrate carrying devices 84 disposed on the opposite sides of the stage 76, respectively, detachably hold the side edges of a substrate G floating above the stage 76 and carry the substrate G longitudinally (in the X-direction) over the stage 76. The substrate G is carried over the stage 76 in a substantially horizontal position with its opposite side edges extended parallel to the X-direction and the front and the rear edge thereof extended perpendicularly to the carrying direction.

As shown in FIG. 5, the stage 76 is divided into five areas $M_1$, $M_2$, $M_3$, $M_4$ and $M_5$ with respect to the longitudinal direction (the X-direction). The left end area $M_1$ is a receiving area. A substrate G is delivered to a predetermined position in the area $M_1$. Lifting pins 86 are arranged at predetermined intervals in the receiving area $M_1$ so as to be vertically movable between a home position below the stage and a supporting position above the stage to receive a substrate G from the carrying arm of the carrying device 54 (FIG. 1) and to place the substrate G on the stage 76. The lifting pins 86 are moved vertically by a receiving lifting pin moving mechanism 85 (FIG. 13) using, for example, air cylinder, not shown, as a driving device.

A flotation-carrying operation is started from the receiving area $M_1$. Many jet openings 88 are arranged in a predetermined density in the upper surface of a part of the stage corresponding to the receiving area $M_1$. High-pressure air or positive-pressure air is jetted through the jet openings 88 to float a substrate G on air at a floating height for receiving the substrate G or a floating height $H_a$. The substrate G does not need to be floated in the receiving area $M_1$ accurately at the floating height $H_a$. It is satisfactory that the floating height $H_a$ is maintained in the range of 250 to 350 μm. Preferably, the size along the carrying direction (the X-direction) of the receiving area $M_1$ is greater than that of the substrate G. An alignment device, not shown, for the positional adjustment of the substrate G may be disposed in the receiving area $M_1$.

The area $M_3$ defined in a middle part of the stage 76 corresponds to a resist solution discharging area or a coating area. A resist solution R is poured through the resist solution discharge nozzle 78 disposed above the coating area $M_3$ onto a substrate G while the substrate G is passing through the coating area $M_3$. The floating height $H_b$ of the substrate G in the coating area $M_3$ determines a coating gap S of, for example, 240 μm between the upper surface, namely, a surface to be worked, of a substrate G and the lower end (the discharge opening) of the nozzle 78. The coating gap S is an important parameter dominating the thickness of the resist solution film and resist consumption. Therefore, the coating gap S needs to be maintained accurately constant. Many jet openings 88 for jetting high-pressure air or positive-pressure air and suction openings 90 for sucking air by suction to float a substrate G on air at the floating height $H_b$ are arranged, for example, in a pattern shown in FIG. 6 in the upper surface of a part of the stage corresponding to the coating area $M_3$. Compressed air jetted through the jet openings 88 exerts vertically upward force and, at the same time, air sucked through the suction opening 90 by suction exerts vertically downward force on a part of a substrate G in the coating area $M_3$. The balance of the opposite vertical forces acting on the substrate G is controlled to maintain the floating height $H_b$ at a set value in the range of, for example, 30 to 50 μm.

The size along the carrying direction (the X-direction) of the coating area $M_3$ may be determined such that the narrow coating gap S can be stably formed directly below the resist solution discharge nozzle 78 and may be smaller than that of a substrate G. For example, the size along the carrying direction of the coating area $M_3$ may be in the range of about ⅓ to about ¼ of that of a substrate G. The resist solution discharge nozzle 78 may be positioned so as to correspond substantially to the middle part of the coating area $M_3$.

Figure 6:
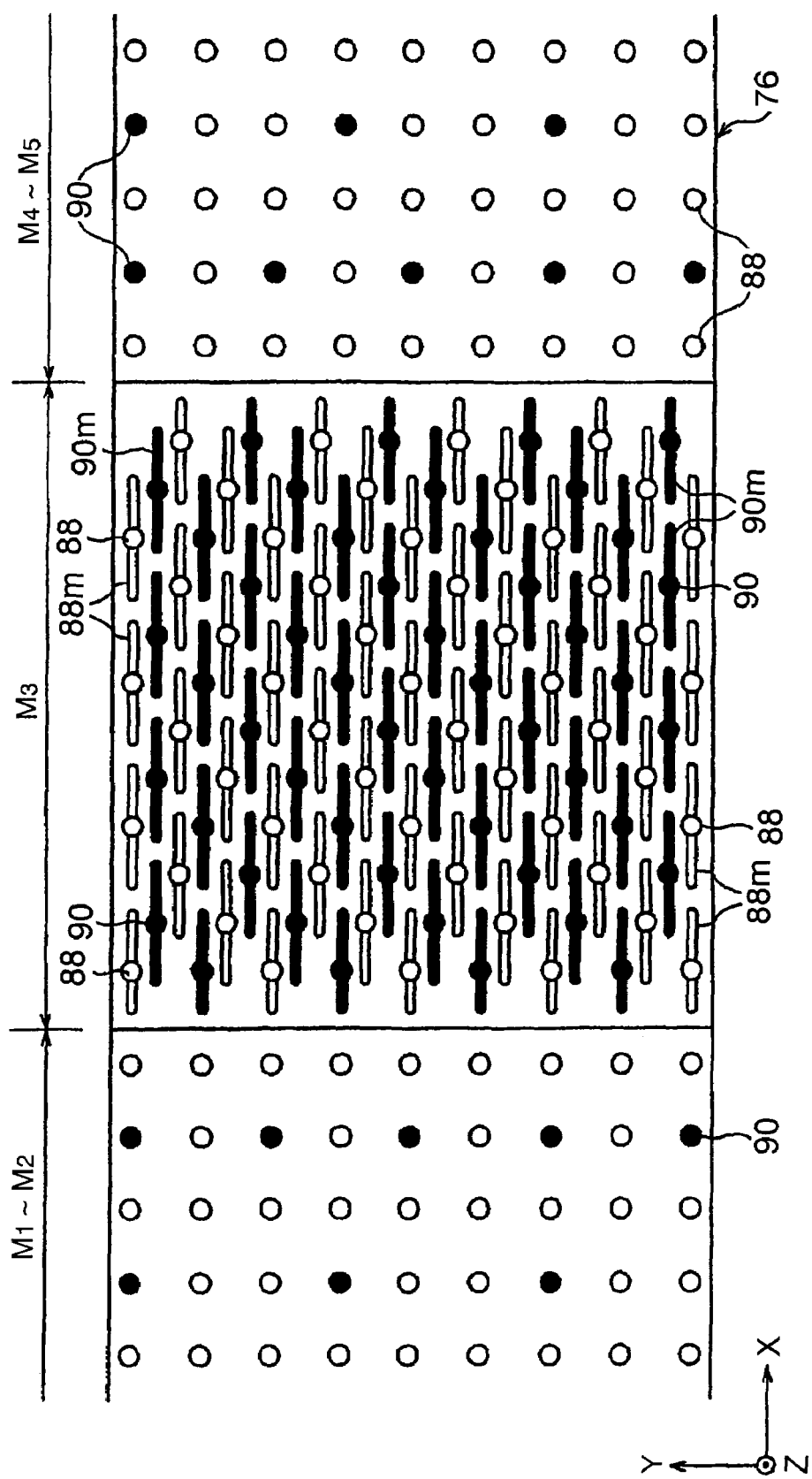
FIG. 6 is a plan view of assistance in explaining a pattern in which jet openings and suction openings are arranged in a coating area on a stage included in the coating unit and the layout of slots.
Figure 7A:
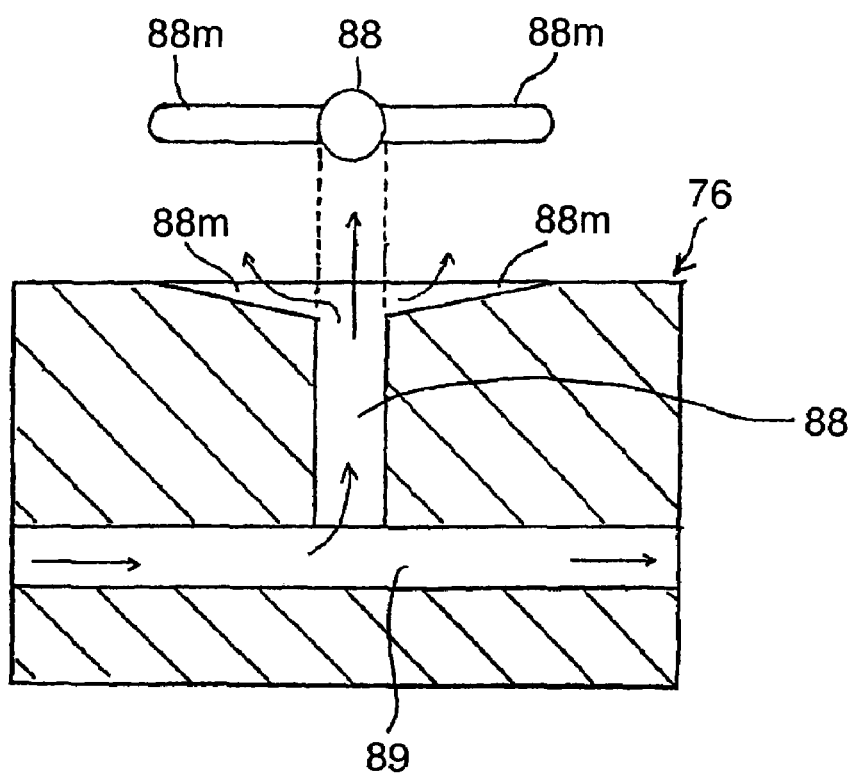
FIG. 7A is a sectional view of a jet opening in a preferred embodiment and slots connecting to the jet opening.
Figure 7B:
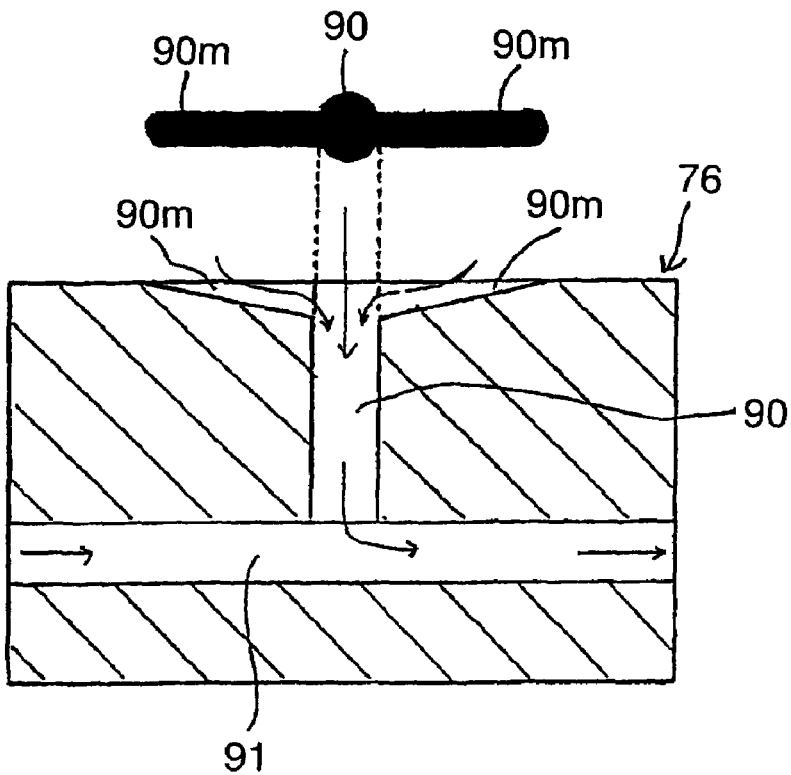
FIG. 7B is a sectional view of a suction opening in the preferred embodiment and slots connecting to the suction opening.

Referring to FIG. 6, slots 88*m* and 90*m* parallel to the carrying direction (the X-direction) are extended from all the jet openings and all the suction openings in the coating area $M_3$. As shown in FIGS. 7A and 7B, the jet openings 88 and the suction openings 90 are connected to compressed air supply passages 89 and suction passages 91, respectively. The compressed air supply passages 89 and the suction passages 91 are formed in the stage 78 or in a lower part of the stage 78. The slots 88*m* and 90*m* are extended straight from the upper ends of the jet openings 88 and the upper ends of the suction openings 90, respectively, in the carrying direction (the X-direction) and a direction opposite the carrying direction. The slots 88*m* and 90*m* slope up from its base toward its free end such that the depth thereof decreases gradually from the base toward the free end. Functions of the slots 88*m* and 90*m* will be described later.

Referring again to FIG. 5, the intermediate area $M_2$ between the receiving area $M_1$ and the coating area $M_3$ is a transition area in which the floating height of a substrate G changes from the floating height $H_a$ in the receiving area $M_1$ to the floating height $H_b$ in the coating area $M_3$. Jet openings 88 and suction openings 90 may be distributed in the upper surface of a part of the stage 76 corresponding to the transition area $M_2$. When both the jet openings 88 and the suction openings 90 are formed in the transition area $M_2$, the density of the suction openings 90 may be increased gradually in the carrying direction such that the floating height of a substrate G being carried changes gradually from the height $H_a$ to the height $H_b$. The upper surface of the part of the stage 76 corresponding to the transition area $M_2$ may be provided with only jet openings 88 and not provided with suction openings 90.

The area $M_4$ on the downstream side of the coating area $M_3$ is a transition area in which the floating height of a substrate G being carried is changed from the floating height $H_b$ to a delivery floating height $H_c$ in the range of, for example, 250 to 350 μm.

Jet openings 88 and suction openings 90 may be distributed in the upper surface of a part of the stage 76 corresponding to the transition area $M_4$ also. When both the jet openings 88 and the suction openings 90 are formed in the transition area $M_4$, it is preferable that the density of the suction openings 90 is decreased gradually in the carrying direction. . . . The upper surface of the part of the stage 76 corresponding to the transition area $M_4$ may be provided with only jet openings 88 and not provided with suction openings 90.

The area $M_5$ at the downstream end (the right-hand end) of the stage 76 is a delivery area. The substrate G processed by a coating process by the coating unit (CT) 40 is carried from a predetermined position or a delivery position in the delivery area $M_5$ by the carrying arms 74 (FIG. 3) to the vacuum drying unit (VD) 42 (FIG. 3) on the downstream side of the coating unit (CT) 40. In the delivery area $M_5$, jet openings 88 for floating the substrate G at a floating height $H_c$ for delivery are arranged in a predetermined density in the upper surface of a part of the stage corresponding to the delivery area $M_5$. Lifting pins 92 are arranged at predetermined intervals in the delivery area $M_5$ so as to be vertically movable between a home position below the stage and a supporting position above the stage to transfer a substrate G from a position above the stage 76 to the carrying arms 74 (FIG. 3). The lifting pins 92 are moved vertically by a delivery lifting pin moving mechanism 91 (FIG. 13) using, for example, air cylinder, not shown, as a driving device.

The resist solution discharge nozzle 78 has a long nozzle body of a length along a direction (a Y-direction) perpendicular to the carrying direction long enough to cover a part of a substrate G between the opposite sides of the substrate G on the stage 76. The nozzle body is provided in its lower end with a discharge opening 78*a* having the shape of a slit. The resist solution discharge nozzle 78 is supported on a support structure having the shape of a gate or an inverted letter U so as to be vertically movable and is connected to a resist solution supply system 95 (FIG. 13) by a resist solution supply pipe 94 (FIG. 4).

Figure 8:
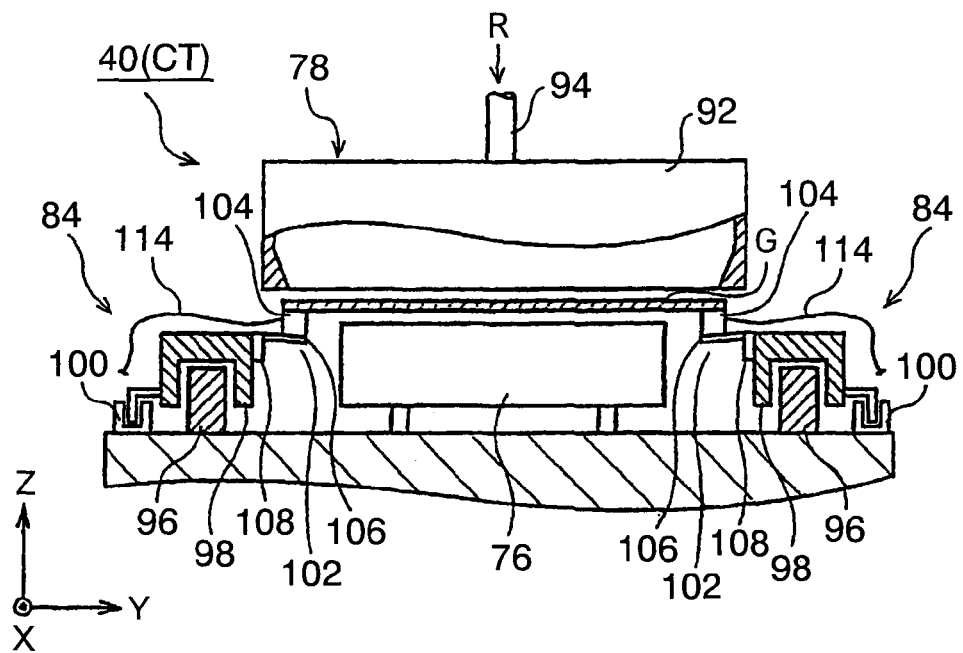
FIG. 8 is a partly sectional side elevation of a substrate carrying mechanism of the coating unit.
Figure 9:
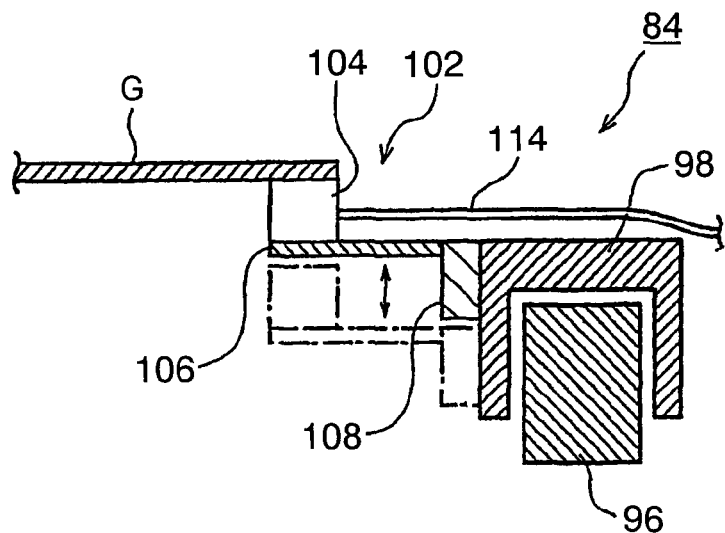
FIG. 9 is an enlarged sectional view of a holding device included in the substrate carrying mechanism of the coating unit.

Referring to FIGS. 4, 8 and 9, the substrate carrying devices 84 include a pair of guide rails 96 extended respectively along the right and the left side of the stage 76, sliders 98 slidably mounted respectively on the guide rails 96, driving devices 100 respectively for driving the sliders 98 for straight sliding in a longitudinal direction (the X-direction) on the guide rails 96, and holders 102 extending from the sliders 88, respectively, toward the center of the stage 76 and respectively capable of detachably holding the right and the left side edge of a substrate G.

The driving devices 100 are, for example, linear motors, namely, linear driving mechanisms. The holders 102 have suction pads 104 that are made to stick to the lower surfaces of the right and the left side parts, respectively, of a substrate G by suction, and elastically deformable plate spring type pad support arms 106. Each pad support arm 106 have a free end supporting the suction pad 104 and a base end connected to the slider 98. Each pad support arm 106 can elastically deform such that the height of its free end is variable. The suction pads 104 are arranged at fixed pitches in a line and are supported individually on the pad support arms 106. Thus, the suction pads 104 and the pad support arms 106 can individually support a substrate G at different heights, respectively.

Referring to FIGS. 8 and 9, the pad support arm 106 is attached to a plate-shaped pad lifting member 108 vertically movably supported on the inner side surface of the slider 98. A pad actuator 109 (FIG. 13), such as an air cylinder, mounted on the slider 98 moves the pad lifting member 108 vertically between a home position (a low position) lower than a floating substrate G and a high position (working position).

Figure 10:
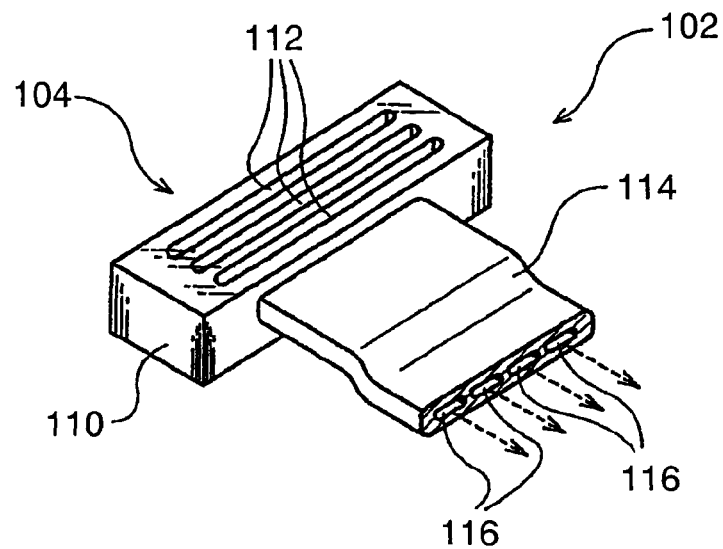
FIG. 10 is a perspective view of a pad device included in the substrate carrying mechanism of the coating unit.
Figure 13:
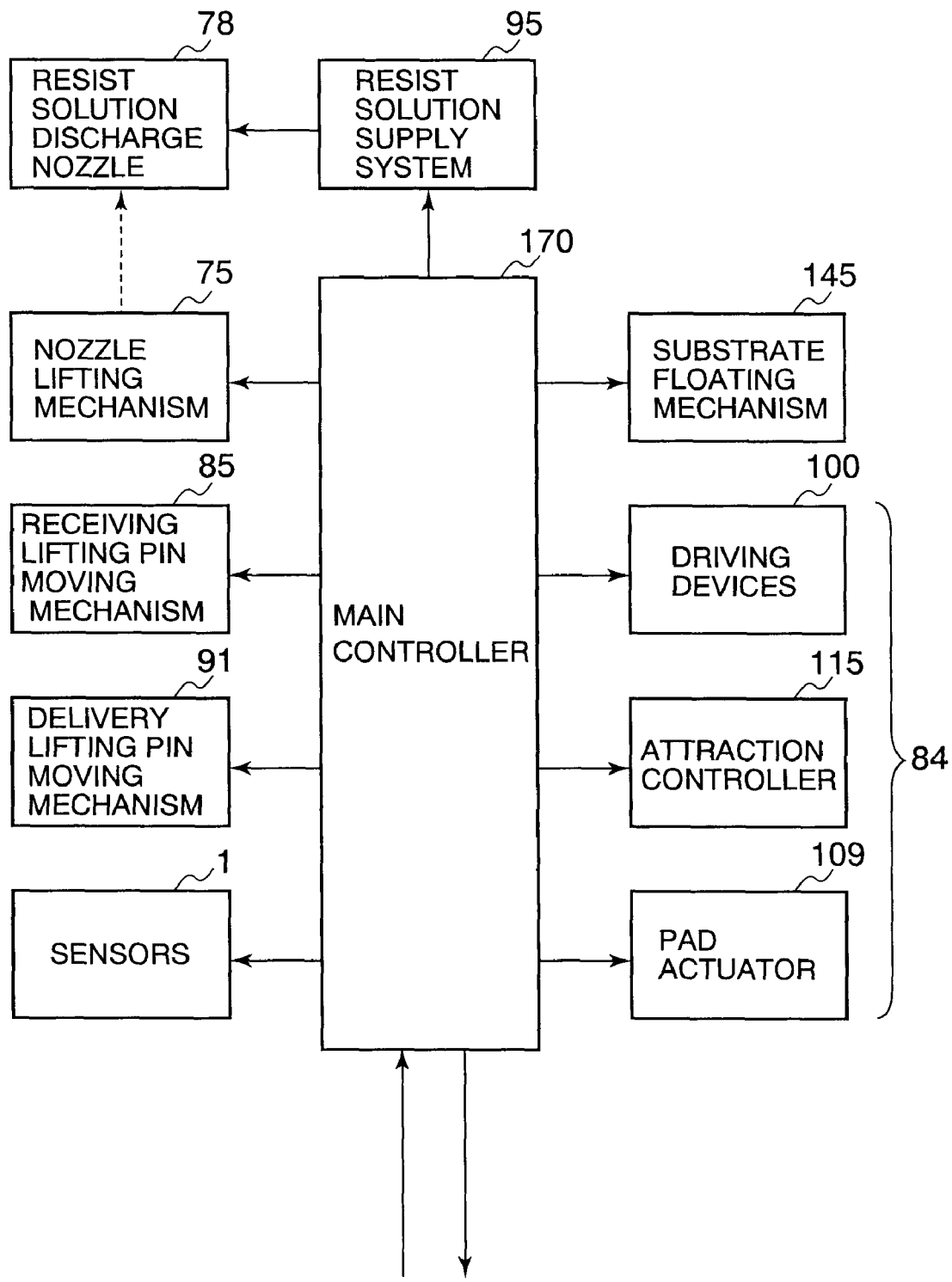
FIG. 13 is a block diagram of a control system of the coating unit.

Referring to FIG. 10, each suction pad 104 has a pad body 110 having the shape of a rectangular solid, made of, for example, a synthetic rubber and provided in its upper surface with a plurality of suction openings 112. The suction openings 112 are elongate openings having the shape of a slit, the suction openings 112 may be small round openings or small rectangular openings. A band-shaped vacuum pipe 114 made of, for example, a synthetic resin is connected to the suction pad 104. The vacuum pipe 114 is provided with passages 116 connected to a vacuum source included in an attraction controller 115 (FIG. 13).

As shown in FIG. 4, it is preferable that the holders 102 have two completely independent sets each of the suction pads 104 arranged in a line and the separate pad support arms 106, respectively.

Figure 11:
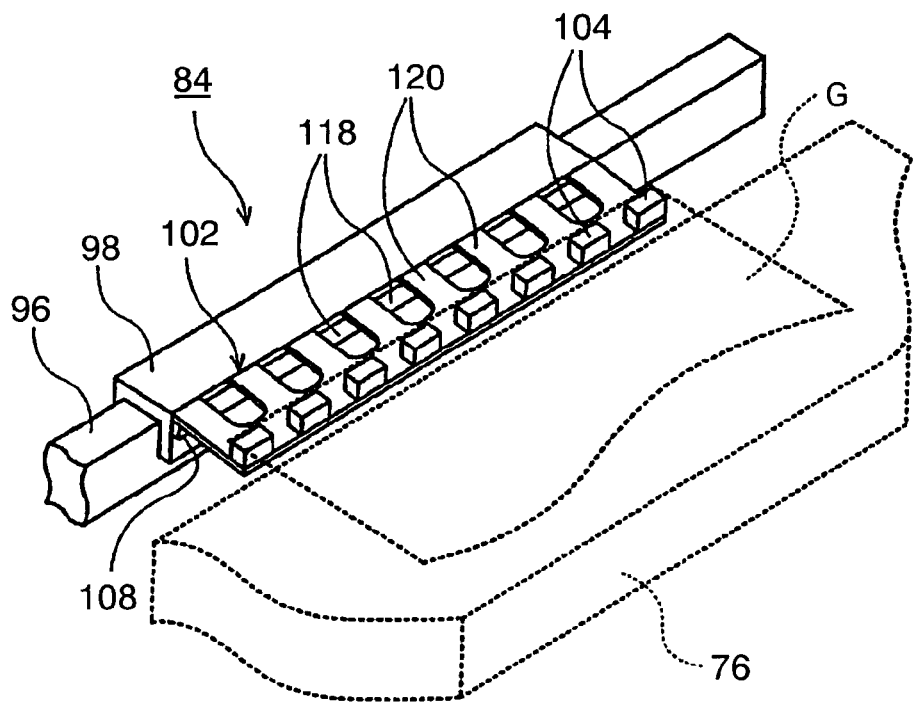
FIG. 11 is a perspective view of a holding device in a modification of the holding device included in the substrate carrying mechanism of the coating unit.

The holder 102 may have a pad support arm 120 formed by forming recesses 118 in a single plate spring, and suction pads 104 arranged in a line on the pad support arm 120 as shown in FIG. 11.

A compressed air supply system 122 (FIG. 12) for supplying compressed air to the jet openings 88 to produce flotation force, and a vacuum system 124 (FIG. 12) for suck air through the many suction openings 90 formed in addition to the jet openings 88 formed in the upper surface of the part of the stage 76 corresponding to the coating area $M_3$ constitute a substrate floating mechanism 145 (FIG. 13) for floating a substrate G at a floating height suitable for high-speed substrate carrying in the receiving area $M_1$ and the delivery area $M_5$, and floats a substrate G at the set floating height suitable for stable, accurate resist solution application operation.

Figure 12:
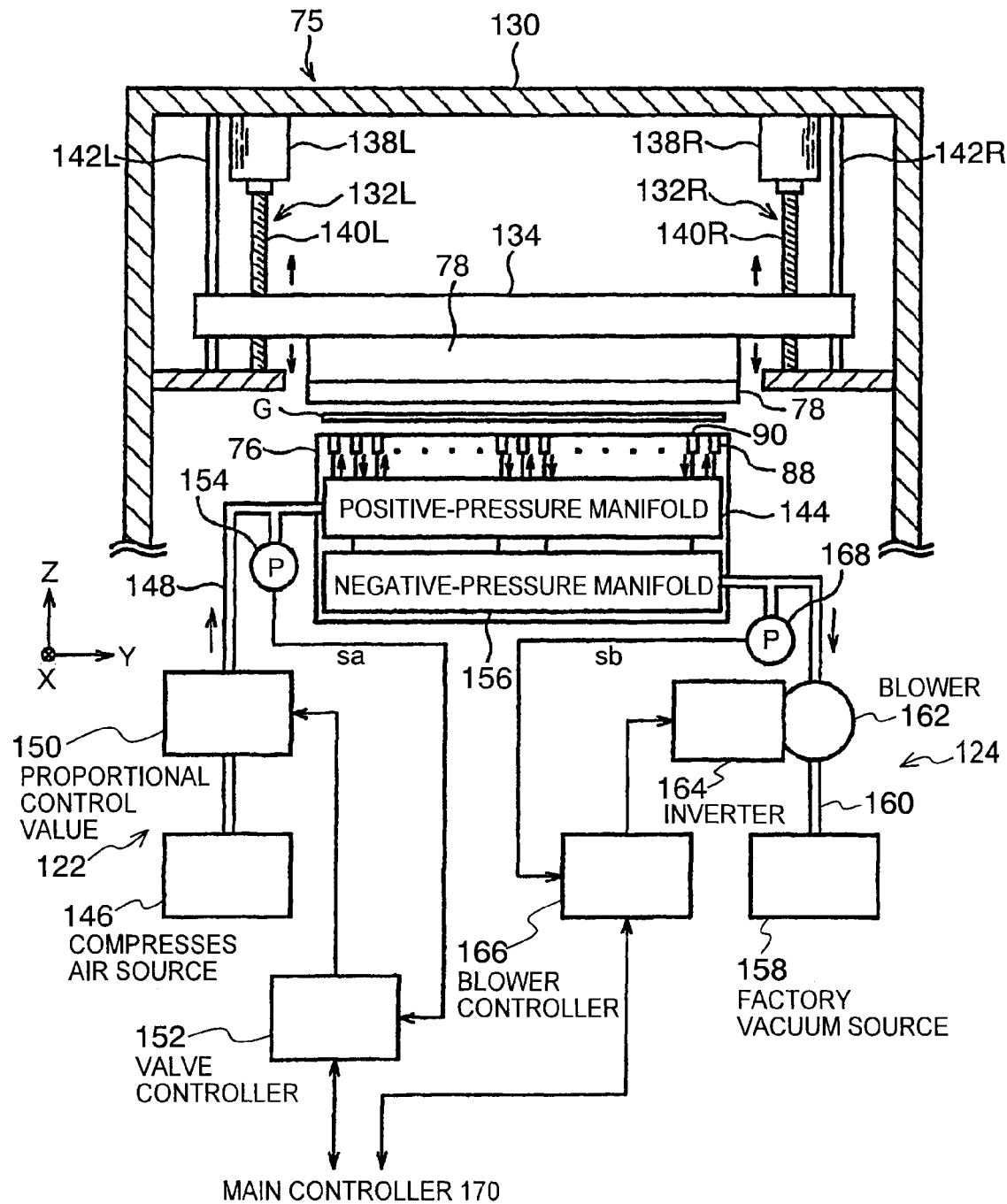
FIG. 12 is a view of a nozzle lifting mechanism, a compressed air supply system and a vacuum system included in a substrate carrying device of the coating unit.

FIG. 12 shows a nozzle lifting mechanism 75, the compressed air supply system 122 and the vacuum system 124. The nozzle lifting mechanism 75 includes a gate frame 130 straddling the coating area $M_3$ in a horizontal direction (the Y-direction) perpendicular to the carrying direction (the X-direction), a right-hand, vertical drive mechanism 132R and a left-hand, vertical drive mechanism 132L supported on the gate frame 130, and a nozzle support member 134, namely, a movable member (lifting member). Driving devices for driving the vertical drive mechanisms 132R and 132L include electric stepper motors 138R and 138L, ball screws 140R and 140L and guide members 142R and 142L. Rotational motions of the stepper motors 138R and 138L are converted into vertical linear motions by the ball screw mechanisms (140R and 142L, and 140L and 142L) to move the resist solution discharge nozzle 78 vertically together with the nozzle support member 134.

The respective vertical movements and vertical positions of the right and the left end of the resist solution discharge nozzle 78 are controlled optionally by the angular movements and angular positions of the stepper motors 138R and 138L. The nozzle support member 134 is, for example, a rigid prism. The resist solution discharge nozzle 78 is detachably attached to the side or the lower surface of the nozzle support member 134 with flanges and bolts.

The compressed air supply system 122 includes a positive-pressure manifold 144 connected to the jet openings 88 of the areas on the upper surface of the stage 76 by the compressed air supply passages 89 (FIG. 7A), a compressed air supply pipe 148 for carrying compressed air from a factory compressed air source 146 to the positive-pressure manifold 144, a proportional control valve 150, such as a electropneumatic regulator, placed in the compressed air supply pipe 148, and a valve controller 152 for controlling the opening of the proportional control valve 150. A pressure sensor 154, namely, a pressure gage for measuring gage pressure, is placed in the compressed air supply pipe 148 on the secondary side of the proportional control valve 150. The valve controller 152 receives a measured-pressure signal sa provided by the pressure sensor and controls the opening of the proportional control valve 150 in a variable control mode so that the measured-pressure signal sa coincides with a predetermined reference value provided by a main controller 170 (FIG. 13).

The vacuum system 124 includes a negative-pressure manifold 156 connected to the suction openings 90 of the areas on the upper surface of the stage 76 by the suction passages 91 (FIG. 7B), a suction pipe 160 connecting the negative-pressure manifold 156 to a factory vacuum source 158, a blower 162 placed in the suction pipe 160, and a blower controller 166 for driving and controlling the blower 162 through an inverter 164. A pressure sensor 168 is attached to the suction pipe 160 on the secondary side of the blower 162. The blower controller 166 receives a measured-pressure signal sb provided by the pressure sensor 168, namely, the output signal of the pressure sensor 168, and controls the rotation of the blower 162 in a variable control mode so that the measured-pressure signal coincides with a predetermined reference value provided by the main controller 170.

FIG. 13 shows the principal components of a control system for controlling the coating unit (CT) 40 in this embodiment. The main controller 170 is a microcomputer. The main controller 170 executes the control of individual operations of the components of the coating unit, more specifically, the resist solution supply system 95, the nozzle lifting mechanism 75, the substrate floating mechanism 145, the substrate carrying mechanisms 84 (driving devices 100, the attraction controller 115 and the pad actuator 109), the receiving lifting pin moving mechanism 85 and the delivery lifting pin moving mechanism 91 and sequential control of those operations.

The operations of the coating unit (CT) 40 for carrying out a coating process will be described. The main controller 170 fetches a coating process control program from a storage medium, such as an optical disk and stores the same in a main memory. The main controller 170 executes the coating process control program to control a series of coating operations.

The carrying device 54 (FIG. 1) carries an unprocessed, new substrate G to the receiving area $M_1$ of the stage 76. Then, the lifting pins 86 are raised to the working position to receive the substrate G. After the carrying device 54 has been retracted, the lifting pins 86 are lowered to position the substrate G at a transfer position at the floating height $H_a$ (FIG. 5). Subsequently, the alignment device, not shown, is actuated to press the floating substrate G from four directions by pressing members, not shown to position the substrate G in place above the stage 76. After the completion of an aligning operation, the pad actuators 109 of the substrate carrying devices 84 raise the suction pads 104 from the home position (retracted position) to the supporting position (the working position). The sucking action of the suction pads 104 has been effectuated before the suction pads 104 are raised to the supporting position. Therefore, upon the contact of the suction pads 104 with the side edges of the substrate G, the substrate G is attracted to the suction pads 104 by suction. The alignment device retracts the pressing members to their home positions immediately after the connection of the suction pads 104 to the side edges of the substrate G.

Then, the sliders 98 of the substrate carrying devices 84 holding the side edges of the substrate G by the holders 102 are moved straight from starting positions in the carrying direction (the X-direction) at a comparatively high fixed speed. The substrate G floating above the stage 76 is moved linearly in the carrying direction (the X-direction). Upon the arrival of the front end of the substrate G at a set position or a coating start position in the coating area $M_3$, the substrate carrying devices 84 stops a first substrate carrying stage.

After the front end of the substrate G has arrived at the set position, namely, the coating starting position, in the coating area $M_3$ and the substrate G has been stopped, the main controller 170 controls the nozzle lifting mechanism 75 to move the resist solution discharge nozzle 78 vertically down to a coating position at a predetermined height so that a coating gap may be formed between the discharge opening 78a and the substrate G. Then, the resist solution supply system 95 (FIG. 13) starts a resist discharging operation for discharging the resist solution R and, at the same time, the substrate carrying devices 84 starts a second substrate carrying stage. In the second substrate carrying stage for coating, the substrate G is carried at a comparatively low carrying speed $V_s$.

Figure 14:
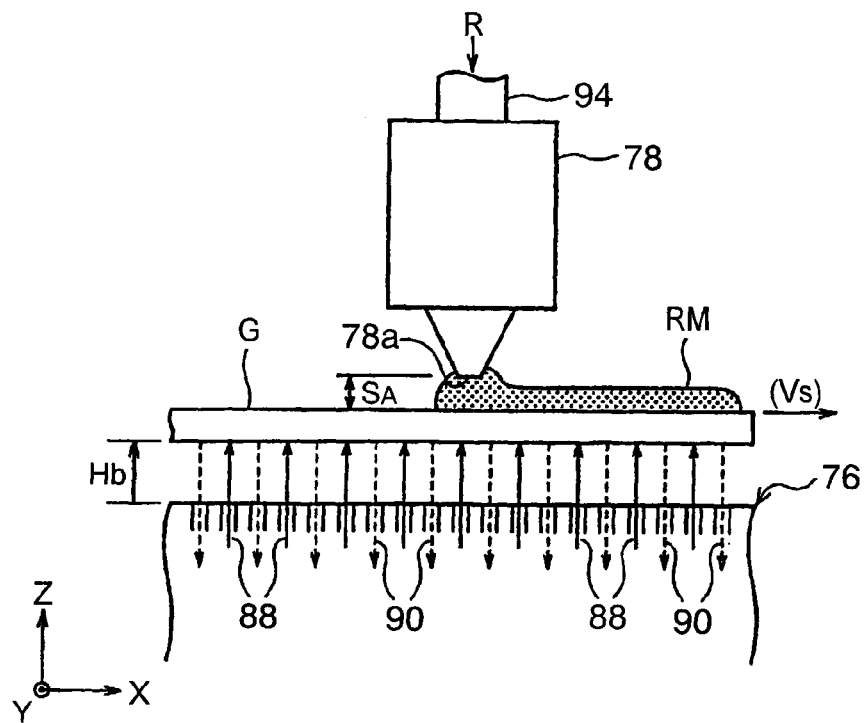
FIG. 14 is a side elevation of assistance in explaining formation of a resist solution film by the coating operation of the embodiment.
Figure 15:
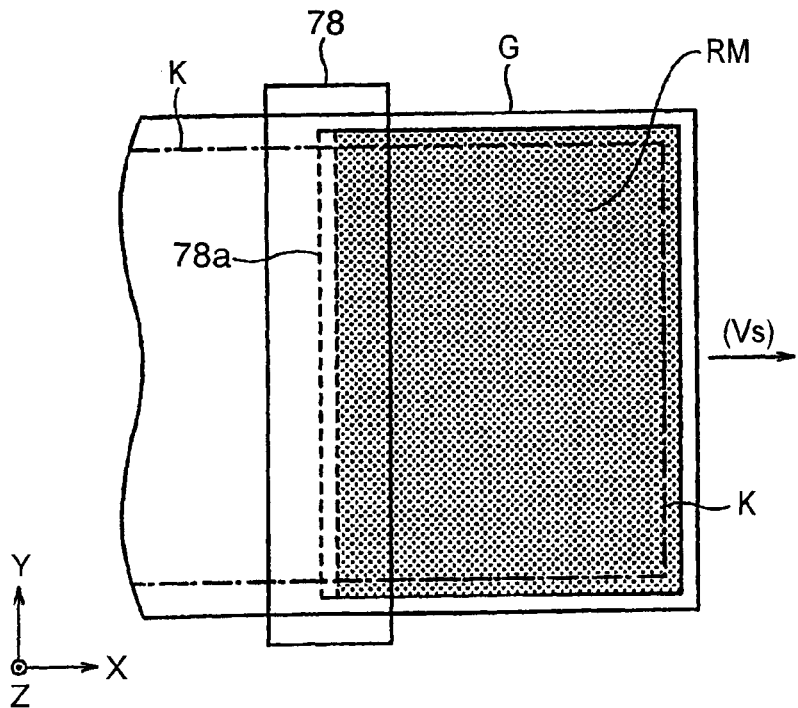
FIG. 15 is a plan view of assistance in explaining formation of a resist solution film by the coating operation of the embodiment.

Thus, the substrate G supported in a horizontal position is moved in the carrying direction (the X-direction) at the predetermined carrying speed $V_s$ and, at the same time, the elongate resist solution discharge nozzle 78 discharges the resist solution R in a band onto the substrate G being carried under the resist solution discharge nozzle 78. Consequently, a resist solution film RM of the resist solution R is formed on the upper surface of the substrate G from the front toward the rear end of the substrate G as shown in FIGS. 14 and 15. In FIG. 15, chain lines K are boundary lines demarcating a product-forming area (inner area) and an edge area (outer or marginal area) on the substrate G from each other.

Figure 16:
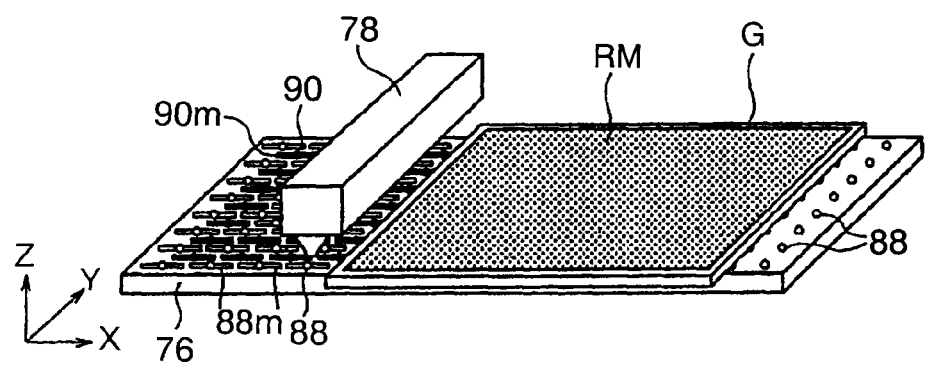
FIG. 16 is a perspective view of parts on the state at the completion of the coating operation of the embodiment.

The resist solution supply system 95 stops the discharge of the resist solution R through the resist solution discharge nozzle 78 just before the completion of the coating operation in the coating area $M_3$, i.e., at a moment when the rear end of the substrate G is about to pass by a position directly below the resist solution discharge nozzle 78 as shown in FIG. 16.

At the same time, the nozzle lifting mechanism 75 moves the resist solution discharge nozzle 78 vertically up to separate the resist solution discharge nozzle 78 away from the substrate G. Meanwhile, the substrate carrying devices 84 start operating for a third substrate carrying stage in which the substrate G is carried at a comparatively high carrying speed. The operation of the substrate carrying devices 84 for the third substrate carrying stage is stopped upon the arrival of the substrate G at a carrying operation stopping position in the delivery area $M_5$. The attraction controller 115 stops sucking air through the suction pads 104 and, at the same time, the pad actuator 109 lowers the suction pads 104 from the high position (working position) to the home position (a low position) to separate the suction pads 104 from the opposite side edges of the substrate G. At this stage, the attraction controller 115 supplies compressed air of a positive pressure to the suction pads 104 to separate the suction pads 104 quickly from the substrate G. Then, the lifting pins 92 are raised from the home position below the stage to the working position above the stage to unload the substrate G.

Then the carrying arm 74, namely, the carrying device, accesses the delivery area $M_5$, receives the substrate G from the lifting pins 92 and carries the substrate G away from the stage 76. The substrate carrying devices 84 are returned to the receiving area $M_1$ rapidly immediately after the substrate G has been transferred to the lifting pins 92. Operations for carrying a new substrate G, namely, the next sub, into the receiving area $M_1$, aligning the new substrate G and starting carrying the new substrate G are started when the processed substrate G is about to be carried out from the delivery area $M_5$.

Matters featuring the coating unit (CT) 40 in this embodiment will be described with reference to FIGS. 17 to 33.

It is a feature of the coating unit (CT) 40 that both the jet openings 88 and the suction openings 90 are arranged in the predetermined pattern in the stage 76 of the coating unit (CT) 40 and the slots 88m and 90m parallel to the carrying direction (the X-direction) are extended from all the jet openings 88 and all the suction openings 90 in the predetermined layout in the coating area $M_3$ as shown in FIG. 6. Effects of a coating unit in a comparative example having jet openings 88 and suction openings 90 and not provided with any slots corresponding to the slots 88m and 90m will be described with reference to FIGS. 17 to 23 and 30A to facilitate understanding the effects of the slots 88m and 90m.

Figure 17:
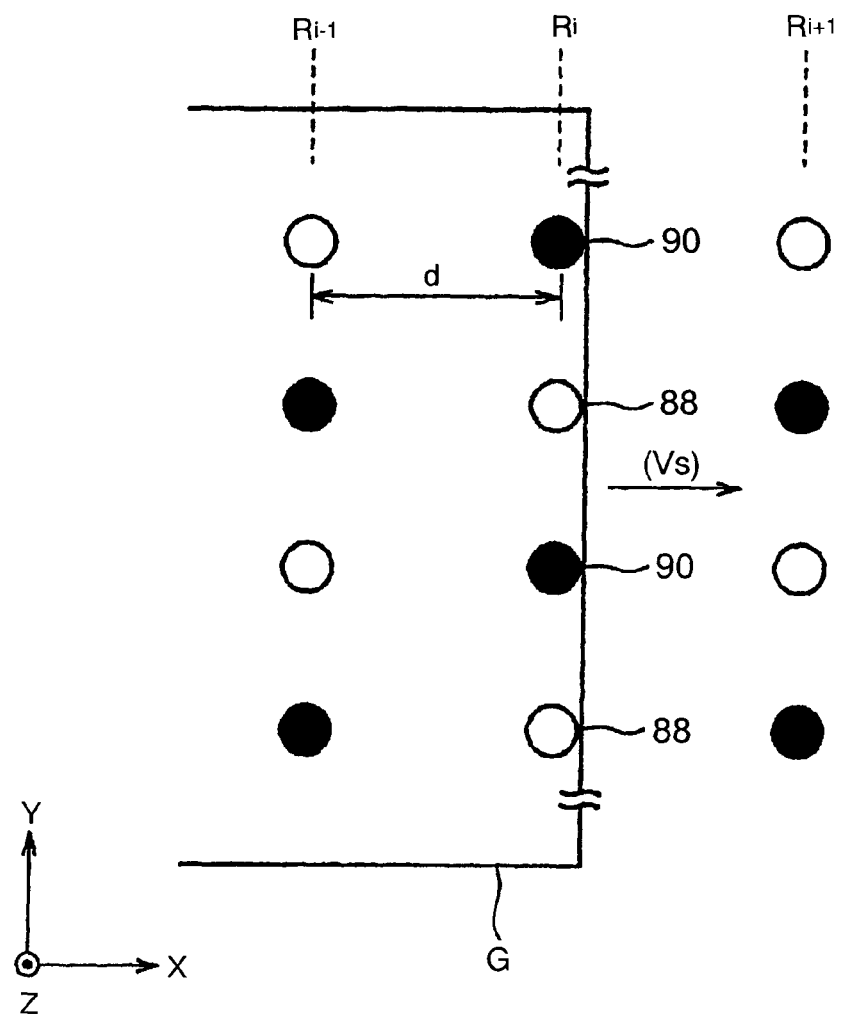
FIG. 17 is a schematic plan view of a stage in a comparative example not provided with slots connecting to jet openings and suction openings formed in a coating area of the stage.

Referring to FIG. 17, when a substrate G is moved at a predetermined speed $V_s$ in the carrying direction (the X-direction) in a coating area $M_3$, the front end of the substrate G covers jet openings 88 and suction openings 90 in rows $R_{i-1}$, $R_i$, $R_{i+1}$, ... successively at a fixed period. It is supposed that the jet openings 88 and the suction openings 90 are arranged in the carrying direction (the X-direction) and a horizontal direction (the Y-direction) perpendicular to the carrying direction in a matrix or a grid.

Figure 18:
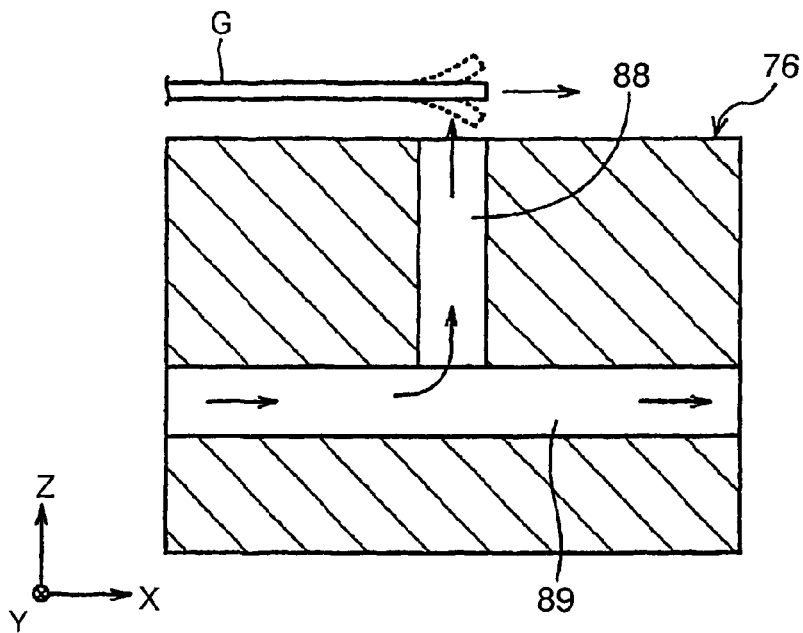
FIG. 18 is a fragmentary sectional view of assistance in explaining air shocks that act on a substrate when the front end of the substrate covers the jet openings/the suction opening in the comparative example.
Figure 19:
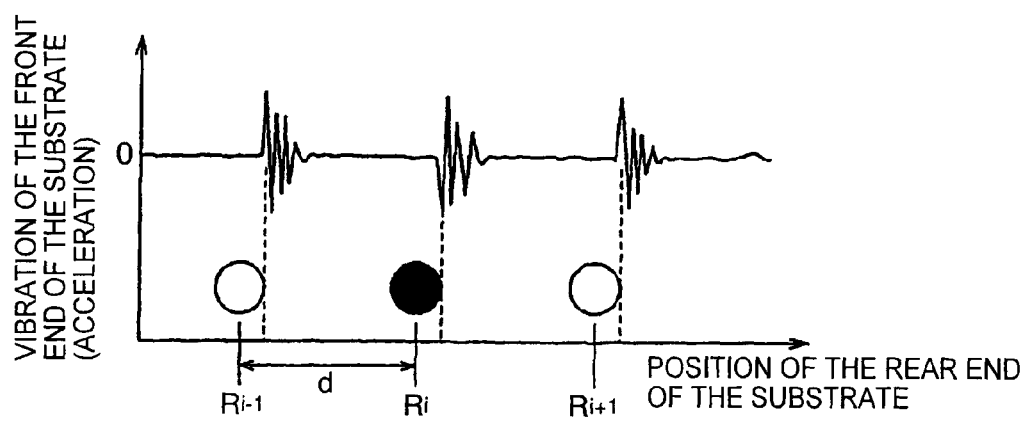
FIG. 19 is a graph showing the waveform of vibrations of the front end of the substrate that occur when the front end of the substrate moving in a carrying direction passes the jet or the suction opening in the comparative example.

Discharge pressure (suction pressure) changes suddenly due to air shocks like water hammer upon the substantially complete coverage of the jet openings 88/the suction openings 90 with a front end part of the substrate G as shown in FIG. 18. Consequently, the front end of the substrate G vibrates vertically (in the Z-directions). As shown in FIG. 19, the front end of the substrate G vibrates periodically in vertical directions every time the front end of the substrate G crosses the jet openings 88/the suction openings 90 in each of the rows $R_{i-1}$, $R_i$, $R_{i+1}$, ....

Figure 20:
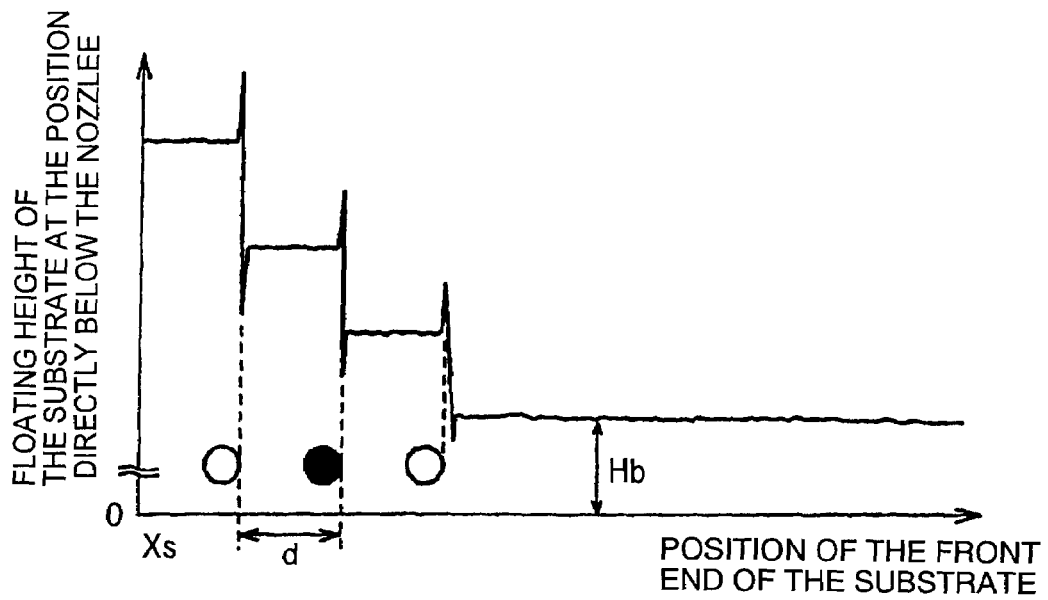
FIG. 20 is a graph showing the waveform of variations of the floating height of the substrate at a position directly below a resist solution discharge nozzle when the front end of the substrate moves from the position directly below the resist discharge nozzle in a carrying direction in the comparative example.

FIG. 20 shows the variations of the floating height of the substrate at a position directly below a resist solution discharge nozzle 78 when the front end of the substrate G moves from a reference position $X_s$ directly below the resist solution discharge nozzle 78 in the carrying direction.

As shown in FIG. 20, the floating height of the substrate G changes (vibrates) greatly and decreases or drops in steps every time the front end of the substrate G passes by the jet openings 88/the suction openings 90 in the rows $R_{i-1}$, $R_i$, $R_{i+1}$, .... Consequently, banded irregularities are formed. In FIG. 20, the horizontal axis on which the position of the front end of the substrate G is measured corresponds to a time axis.

When the front end of the substrate G covers the jet openings 88/the suction openings 90 in each of the rows $R_{i-1}$, $R_i$, $R_{i+1}$, ..., the floating height of the substrate G decreases because the sum of downward forces exerted on the substrate G by the suction openings 90 in the receiving area $M_1$ through the coating area $M_3$ increases a step higher and, at the same time, the sum of upward forces exerted on the substrate G by the jet openings 88 corresponding to the substrate G decreases a step lower. After the area of a part of the coating area $M_3$ covered with the substrate G has exceeded a fixed value, the downward force does not increase, the upward force does not decrease, and the floating height of the substrate G stays stably at a fixed value (Minimum value).

The variation (vibration) of the floating height of the substrate G in a wide range is caused by the vertical vibrations of the front end of the substrate G caused by air shocks that acts on the substrate G when the front end of the substrate G covers the jet openings 88/the suction openings 90 in the rows $R_{i-1}$, $R_i$, $R_{i+1}$, .... The vertical vibrations of the front end of the substrate G attenuate in an exponential function of distance from the front end toward the middle of the substrate G. Therefore, the floating height of the substrate G at the position directly below the resist solution discharge nozzle 78 does not practically vibrate after the front end of the substrate G has moved a predetermined distance from the reference position $X_s$.

When a stage having the coating area $M_3$ provided with the jet openings 88 and suction openings 90 and not provided with slots 88m and 90m in combination with the jet openings 88 and the suction openings 90 is used, the floating height of the substrate G decreases vibrating in a wide range when the front end of the substrate G passes by the position directly below the resist solution discharge nozzle 78 and immediately after the passage of the front end of the substrate G past the position directly below the resist solution discharge nozzle 78. Consequently, the banded irregularities M are formed in a part of the resist solution film coating the front end part of the substrate G as shown in FIG. 30A.

Figure 21:
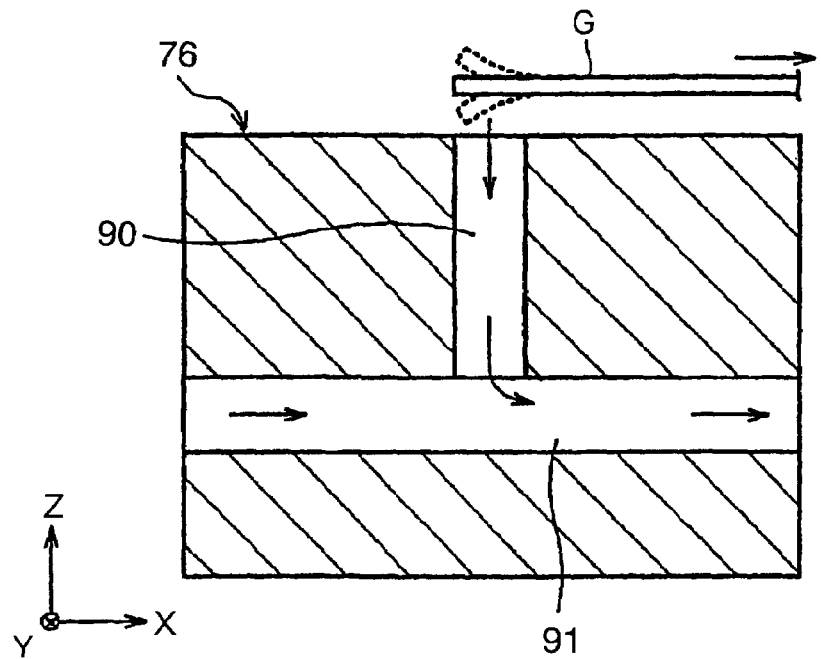
FIG. 21 is a fragmentary sectional view of assistance in explaining air shocks that acts on the substrate when the rear end of the substrate moves past the jet openings/the suction openings in the comparative example.
Figure 22:
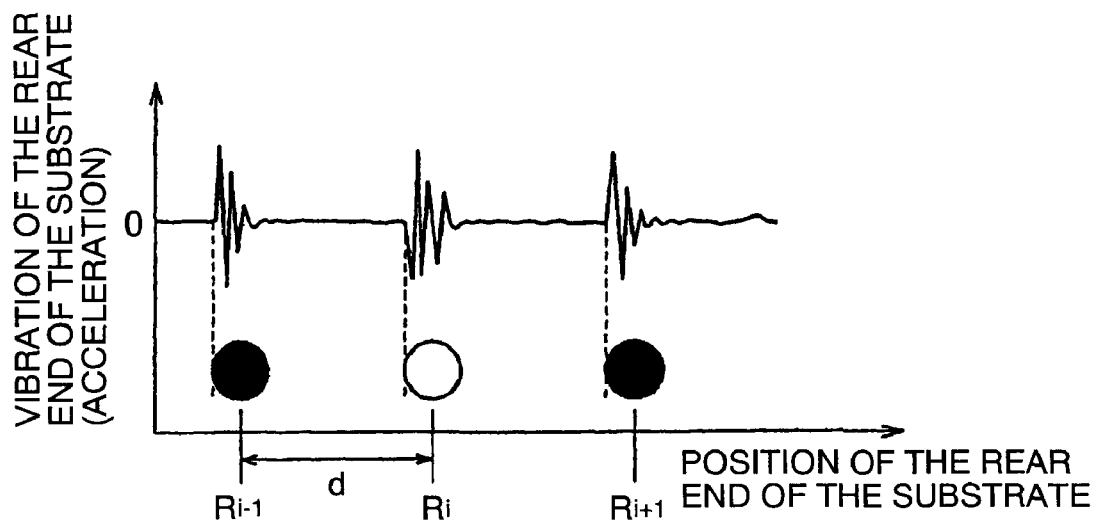
FIG. 22 is a graph showing the waveform of vibrations of the rear end of the substrate when the rear end of the substrate moves past the jet openings/the suction openings in the comparative example.
Figure 23:
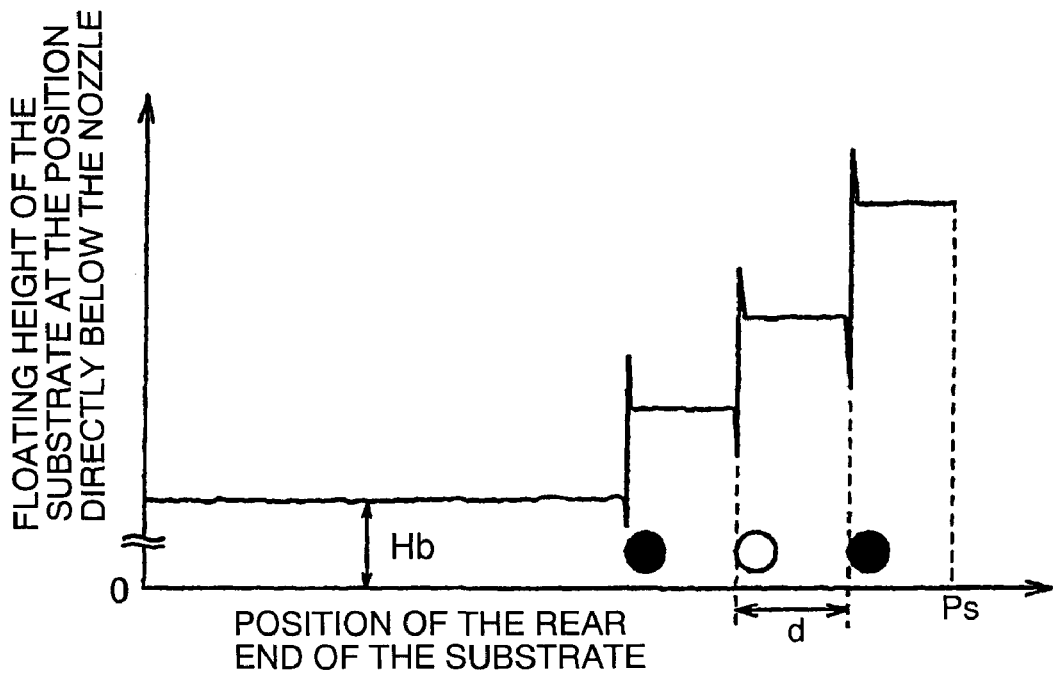
FIG. 23 is a graph showing the waveform of variations of the floating height of the substrate at a position directly below the nozzle when the rear end of the substrate approaches the position directly below the nozzle from the upstream side of the position directly below the nozzle in the comparative example.
Figure 30A:
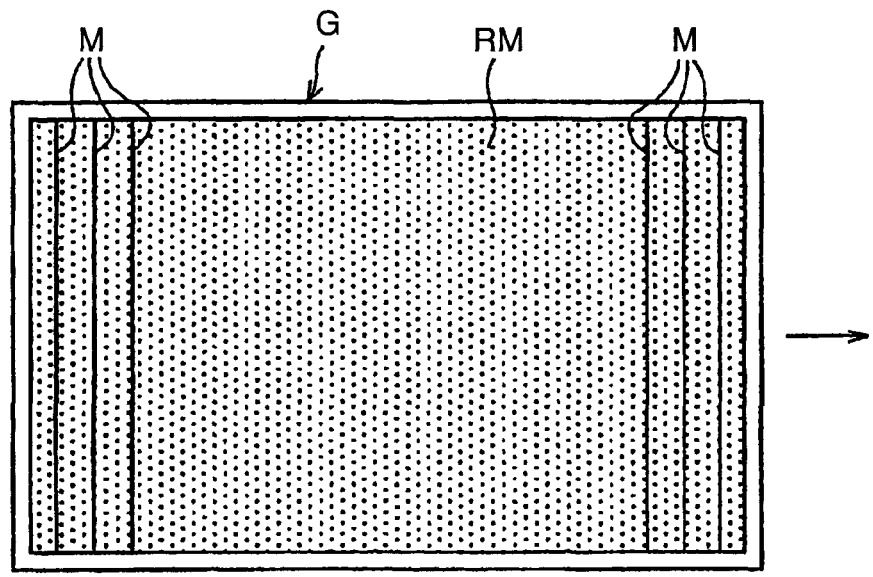
FIG. 30A is a schematic plan view of a resist film formed on a substrate by a comparative example and having conspicuous banded irregularities.

Similarly, banded irregularities M are formed in a rear end part of the substrate G as shown in FIG. 30A. Such banded irregularities M are formed in the rear end part of the substrate G because discharge pressure (suction pressure) changes suddenly due to air shocks at the start of opening the jet openings 88/the suction openings 90 in each of the rows $R_{i-1}$, $R_i$, $R_{i+1}$, . . . to the atmosphere as shown in FIGS. 21 and 22 as the rear end of the substrate G approaches a position at a fixed distance from the reference position $X_s$ directly below the resist solution discharge nozzle 78, and, consequently, the rear end of the substrate G vibrates vertically. As shown in FIG. 23, the floating height of the substrate G changes (vibrates) greatly and increases in steps every time the rear end of the substrate G passes by the jet openings 88/the suction openings 90 in each of the rows $R_{i-1}$, $R_i$, $R_{i+1}$, . . . on the upstream side of the reference position $X_s$. Consequently, banded irregularities are formed. When the rear end of the substrate G opens the jet openings 88/the suction openings 90 in each of the rows $R_{i-1}$, $R_i$, $R_{i+1}$, . . . into the atmosphere, the floating height of the substrate G increases in steps because the sum of downward forces exerted on the substrate G by the suction openings 90 in the coating area $M_3$ through the delivery area $M_5$ decreases a step lower and, at the same time, the sum of upward forces exerted on the substrate G by the jet openings 88 corresponding to the substrate G increases a step higher.

Description will be made of the effect of the present invention at a first stage provided by forming the slots 88m and 90m in combination with the jet openings 88 and the suction openings 90 formed in the coating area $M_3$ of the stage 76 with reference to FIGS. 24 to 27 and 30B.

Figure 24:
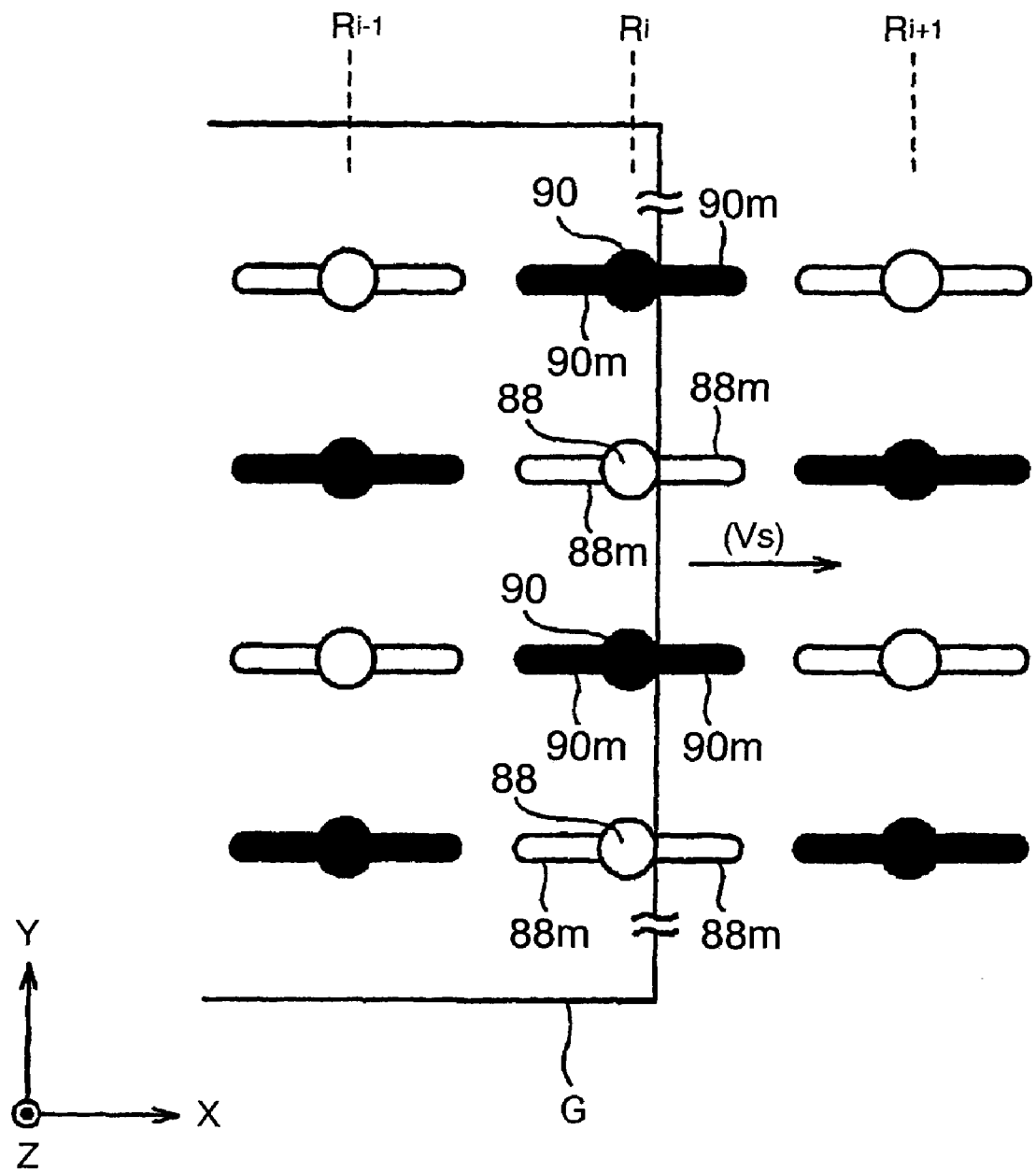
FIG. 24 is a schematic plan view showing the pattern of arrangement of the jet and the suction openings and the layout of slots at the first stage of the present invention.
Figure 25:
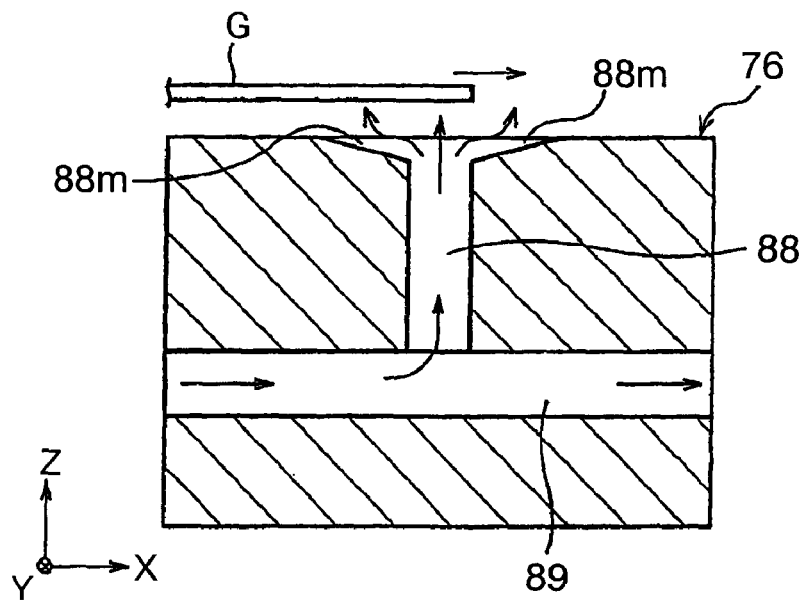
FIG. 25 is a fragmentary sectional view of assistance in explaining weakening air shocks that act on the substrate when the front end of the substrate covers the jet or the suction opening at the first stage of the present invention.
Figure 26:
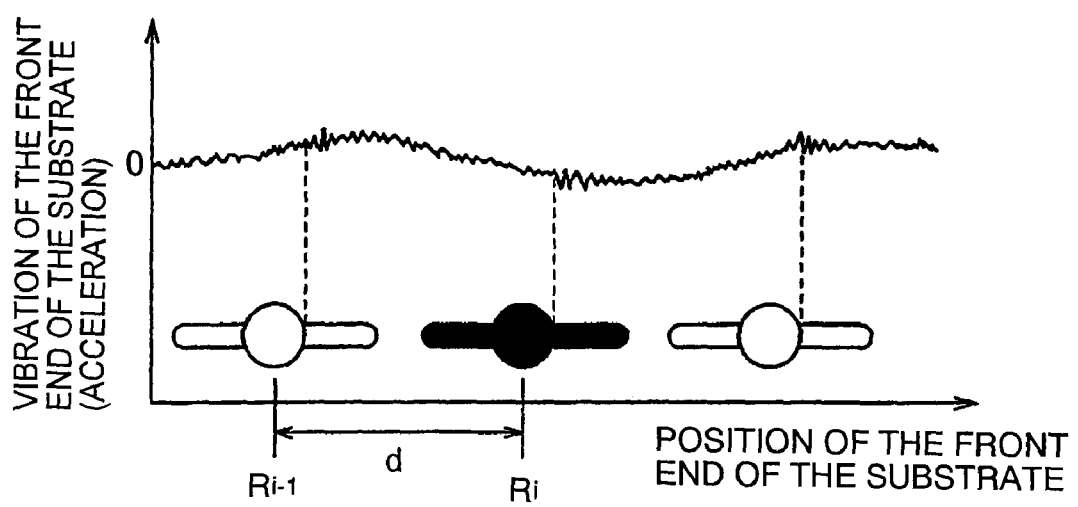
FIG. 26 is a graph showing the waveform of vibrations of the substrate when the front end of the substrate moving in the carrying direction moves past the jet openings/the suction openings.

Referring to FIGS. 24 and 25, when a substrate G is moved at a predetermined speed $V_s$ in the carrying direction (the X-direction) in the coating area $M_3$, the front end of the substrate G covers jet openings 88/suction openings 90 in rows $R_{i-1}$, $R_i$, $R_{i+1}$, . . . successively at a fixed period, which is the same as the comparative example. The slots 88m/90m are extended from the jet openings 88/the suction openings 90, respectively, in the carrying direction. Since the slots 88m/the slots 90m extending from the jet openings 88/the suction openings 90 are opened into the atmosphere at the moment when the front end of the substrate G covers the jet openings 88/the suction openings 90. Consequently, air shocks exerted by the jet openings 88/the suction openings 90 on the front end of the substrate G is lessened considerably. Therefore, as shown in FIG. 26, the vibration of the front end of the substrate G when the front end of the substrate G crosses the jet openings 88/the suction openings 90 in the rows $R_{i-1}$, $R_i$, $R_{i+1}$, . . . is effectively reduced or suppressed.

Figure 27:
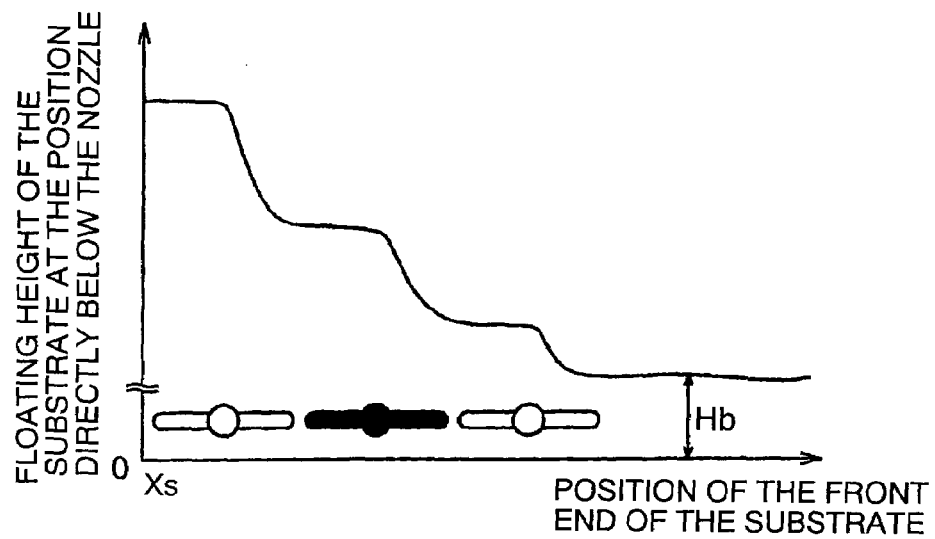
FIG. 27 is a graph showing the variation of the floating height of the substrate at the position directly below the nozzle when the front end of the substrate moves from a reference position directly below the resist discharge nozzle in the carrying direction at the first stage of the present invention.

Although the floating height of the substrate G at the position directly below the resist solution discharge nozzle 78 decreases every time the front end of the substrate G crosses the jet openings 88/the suction openings 90 in the rows $R_{i-1}$, $R_i$, $R_{i+1}$, . . . , the floating height does not change suddenly or vibrates like the floating height in the comparative example, and decreases moderately in steps as shown in FIG. 27.

Although not shown, air shocks that acts on the rear end of the substrate G when the rear end of the substrate G passes by the jet openings 88/the suction openings 90 in the rows $R_{i-1}$, $R_i$, $R_{i+1}$, . . . are lessened by the slots 88m/90m respectively continuous with the jet openings 88 and the suction openings 90 (particularly, by the slots 88m/90m extending behind the rear end of the substrate G). Consequently, the vertical vibrations are reduced or suppressed remarkably. Although the floating height of the substrate G at the position directly below the resist solution discharge nozzle 78 increases every time the rear end of the substrate G crosses the jet openings 88/the suction openings 90 in the rows $R_{i-1}$, $R_{i+1}$, . . . , the floating height does not change suddenly or vibrates like the floating height in the comparative example, and increases moderately in steps.

Figure 30B:
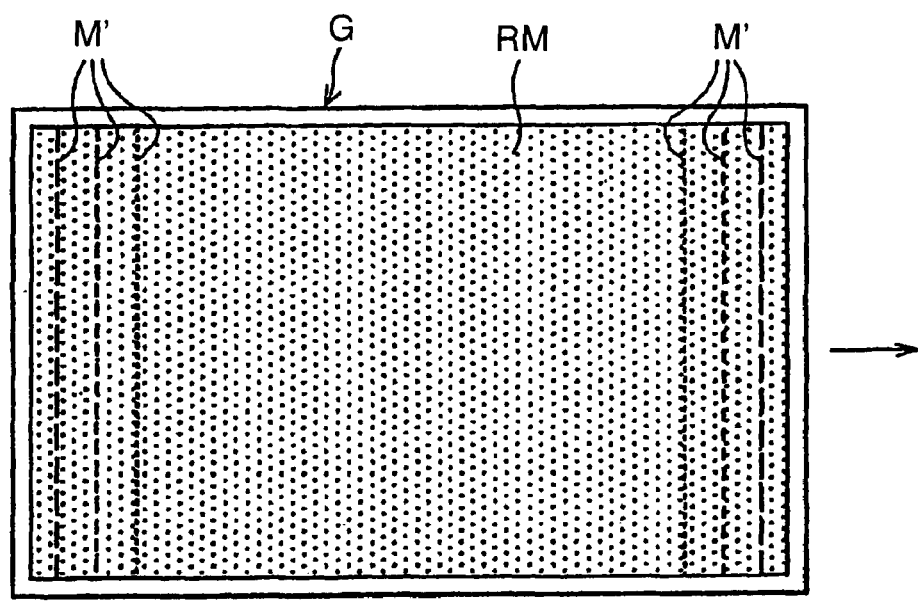
FIG. 30B is a schematic plan view of assistance in explaining the suppression of formation of banded irregularities in a resist film formed on a resist film at the first stage of the present invention.

Slight, inconspicuous banded irregularities indicated by dotted lines M' in FIG. 30B are formed in parts of a resist solution film RM thus formed on the substrate G corresponding to a front and a rear end part of the substrate G. Thus, the thickness quality is improved considerably.

Description will be made of the effect of the present invention at a second stage provided by forming the jet openings 88 and the suction openings 90 in a pattern and forming the slots 88m and 90m in a layout in the coating area $M_3$ of the stage 76 with reference to FIGS. 28, 29 and 30C.

Figure 28:
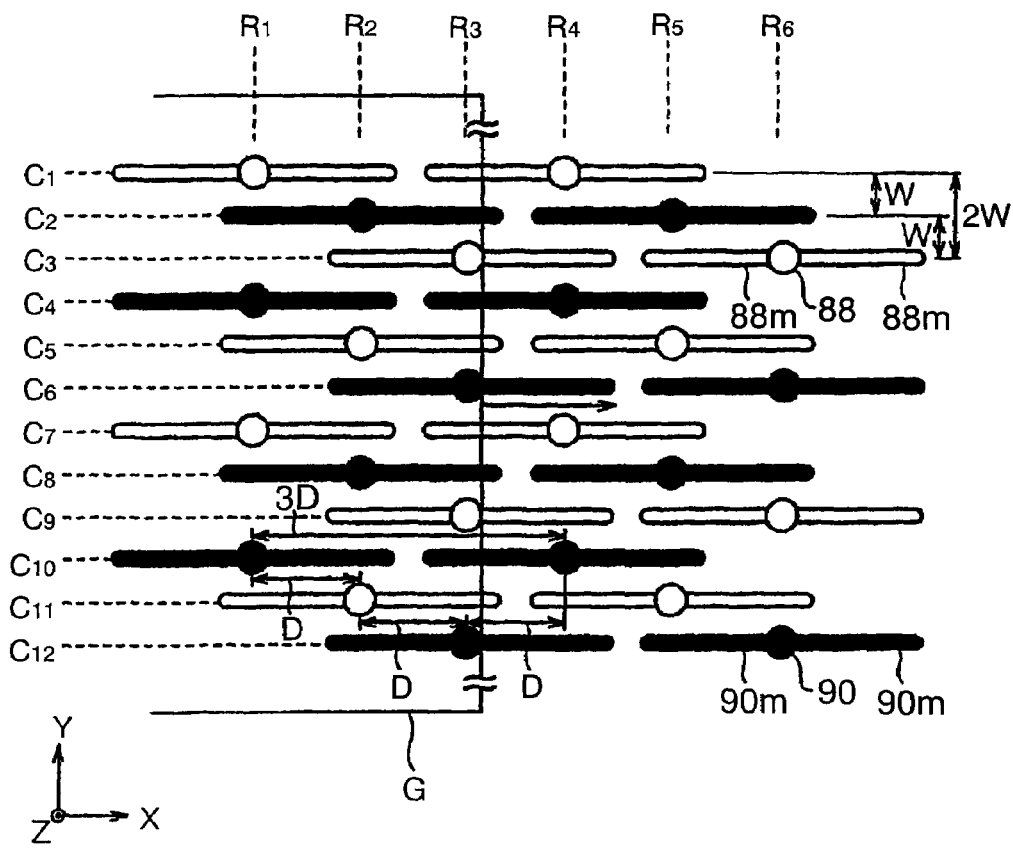
FIG. 28 is a schematic plan view showing a pattern of the arrangement of jet openings and suction openings and the layout of slots at a second stage of the present invention.

Referring to FIG. 28 showing an essential part of FIG. 6 in an enlarged view, in this embodiment, jet openings 88 are formed at a fixed interval 3D on straight jet lines $C_1$, $C_3$, $C_5$, . . . extending in the X-direction and arranged at a fixed pitch 2 W in the Y-direction, and suction openings 90 are formed at a fixed interval 3D on straight suction lines $C_2$, $C_4$, $C_6$, . . . extending in the X-direction and arranged at a fixed pitch 2 W in the Y-direction. The suction lines $C_2$, $C_4$, $C_6$, . . . are spaced apart from the adjacent one of the jet lines $C_1$, $C_3$, $C_5$, . . . by a fixed distance W.

Thus, the jet lines $C_1$, $C_3$, $C_5$, . . . extending in the X-direction and the suction lines $C_2$, $C_4$, $C_6$, . . . extending in the X-direction are arranged alternately at a fixed pitch W. The jet openings 88 are arranged at the fixed interval 3D on the jet lines $C_{2n-1}$, the suction openings 90 are arranged at the fixed interval 3D on the suction lines $C_{2n}$, and the jet openings 88 and the suction openings 90 on the adjacent ones of the jet lines $C_{2n-1}$ and the suction lines $C_{2n}$ are spaced apart from each other by a fixed distance D with respect to the X-direction.

In the pattern of arrangement in the X-direction, the jet opening 88 on the jet line $C_1$, the suction opening 90 on the suction line $C_4$, the jet opening 88 on the jet line $C_7$ and the suction opening 90 on the suction line $C_{10}$, . . . are arranged at the fixed pitch 3 W in a row $R_1$ parallel to the Y-direction. The suction openings 90 on the suction line $C_2$, the jet opening 88 on the jet line $C_5$, the suction opening 90 on the suction line $C_8$ and the jet opening 88 on the jet line $C_{11}$, . . . are arranged at the fixed pitch 3 W in a row $R_2$ parallel to the Y-direction.

The slots 88m extending from each jet opening 88 extend beyond the adjacent suction openings 90, respectively, with respect to the X-direction so as to overlap the adjacent suction openings 90, respectively, with respect to the Y-direction. The slots 90m extending from each suction opening 90 extend beyond the adjacent jet openings 88, respectively, with respect to the X-direction so as to overlap the adjacent jet openings 88, respectively, with respect to the Y-direction.

When the jet openings 88 and the suction openings 90 are arranged in this pattern and the slots 88m and 90m are arranged in this layout, air shocks that acts on the substrate G upon the substantially complete coverage of the jet openings 88/the suction openings 90 in each of the rows $R_1$, $R_2$, . . . are lessened by the slots 88m/90m connected to the same jet openings 88/suction openings 90 (particularly, by the slots 88m/90m extending forward beyond the front end of the substrate G) and are lessened also by reverse pressures exerted on the substrate G by the adjacent slots 90m/88m on one or both sides with respect to the Y-direction. That is, the slot 90m extends in the X-direction from the adjacent suction opening 90 on one side of the jet opening 88 or the slots 90m extend in the X-direction from the adjacent suction openings 90 on the opposite sides of the jet opening 88, and hence air shocks caused by the positive pressure of the jet opening 88 is moderated by the negative pressure (suction) of the adjacent slot 90m or slots 90m. since the slot 88m extends in the X-direction from the adjacent jet opening 88 on one side of the suction opening 90 or the slots 88m extend in the X-direction from the adjacent jet openings 88 on the opposite sides of the suction opening 90, air shocks caused by the negative pressure of the suction opening 90 is moderated by the positive pressure of the adjacent slot 88m or slots 88m.

When the jet openings 88 and the suction openings 90 are arranged in the pattern of this embodiment, the number $N_A$ of the jet openings 88/the suction openings 90 arranged on a straight line in the Y-direction is smaller than the number $N_S$ of the jet openings 88/the suction openings 90 arranged in a line in the Y-direction as viewed from the X-direction. For example, in FIG. 28, the ratio $N_A/N_S=1/3$ (four to twelve). When the jet openings 88 and the suction openings 90 are arranged in a matrix or a grid as shown in FIGS. 17 and 24, the number $N_A$ (four) of the jet openings 88/the suction openings 90 arranged on a straight line in the Y-direction is equal to the number $N_S$ (four) of the jet openings 88/the suction openings 90 arranged in a line in the Y-direction as viewed from the X-direction.

In this embodiment, the ratio $N_A/N_s$ of the numbers of the jet openings 88/the suction openings to be simultaneously covered with the front end of the substrate G or to be simultaneously opened into the atmosphere by the rear end of the substrate G when the substrate G is moved in the carrying direction (the X-direction) is low. Therefore, air shocks exerted simultaneously by the jet openings 88/the suction openings 90 on the substrate G are suppressed. In view of effectiveness, it is preferable that the ratio $N_A/N_S$ is ½ or below, desirably, ⅓ or below.

Figure 29:
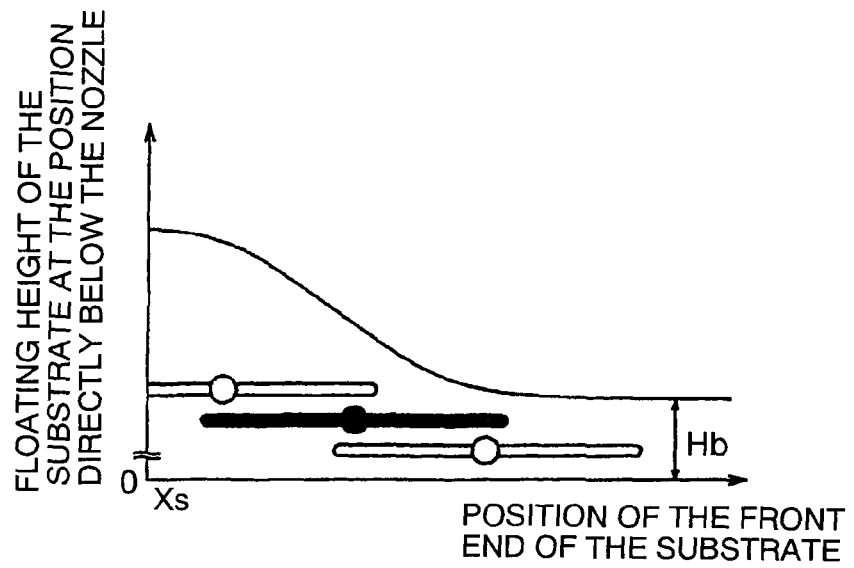
FIG. 29 is a graph showing the variation of the floating height of the substrate at the position directly below the nozzle when the front end of the substrate moves from a reference position directly below the resist discharge nozzle in a carrying direction at the second stage of the present invention.
Figure 30C:
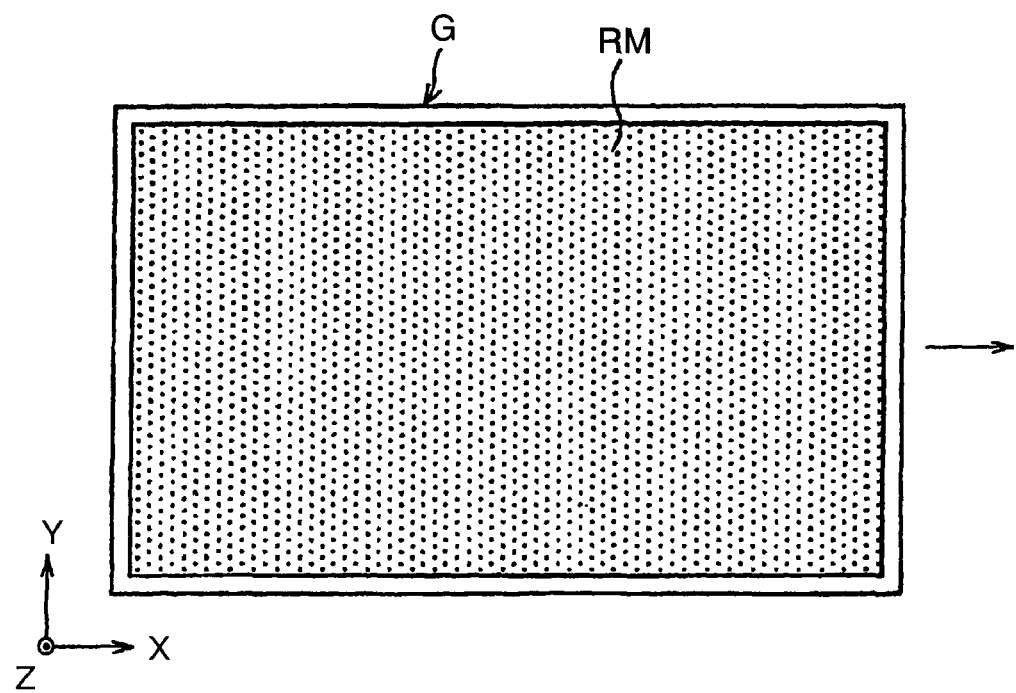
FIG. 30C is a schematic plan view of a resist film scarcely having banded irregularities at the second stage of the present invention.

In this embodiment, the floating height of the substrate G at the position directly below the resist solution discharge nozzle 78 at the moment when the front end of the substrate G passes by the position directly below the resist solution discharge nozzle 78 decreases monotonously in a gentle curve (waveform) and is stabilized at a stable floating height (minimum floating height) $H_b$ as shown in FIG. 29. Therefore, banded irregularities are formed scarcely in the resist solution film RM formed on the substrate G, particularly, in parts of the resist solution film RM formed on the front and the rear end part of the substrate G as shown in FIG. 30C. Thus, the thickness quality of the film is improved remarkably.

As mentioned above, the floating height of the substrate G varies (decreases and increases) immediately after the passage of the front end of the substrate G by the position directly below the resist solution discharge nozzle 78 and immediately before the rear end of the substrate G reaches the position directly below the resist solution discharge nozzle 78. The variation of the floating height varies the gap $S_A$ between the discharge opening 78a of the resist solution discharge nozzle 78 and the substrate G and affects the thickness of the resist solution film on the substrate G. However, since the film thickness variations occur in the opposite end parts of the substrate G and a marginal part, not to be used for forming the product, of the substrate G absorbs most part of the film thickness variations, this embodiment can suppress the film thickness variations in a part, to be used for forming the product, of the substrate G to a negligibly low extent by arranging the jet openings 88 and the suction openings 90 in the foregoing pattern and arranging the slots 88m and 90m in the foregoing layout.

In this embodiment, the compressed air supply system 122 (FIG. 12) and the vacuum system 124 (FIG. 12) of the substrate floating mechanism 145 have a variable pressure control function, the floating height of the substrate G at the position directly below the resist solution discharge nozzle 78 can be corrected such that the gap between the discharge opening 78a of the resist solution discharge nozzle 78 and the substrate G is maintained at the set gap $S_A$ from the start of coating by using that function.

Figure 31:
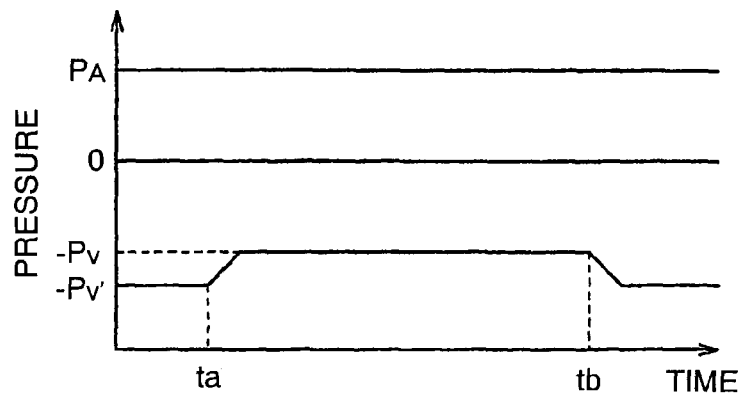
FIG. 31 is a waveform chart of assistance in explaining a pressure control method for correcting the floating height of a substrate at a position directly below the resist discharge nozzle in a preferred embodiment.
Figure 32:
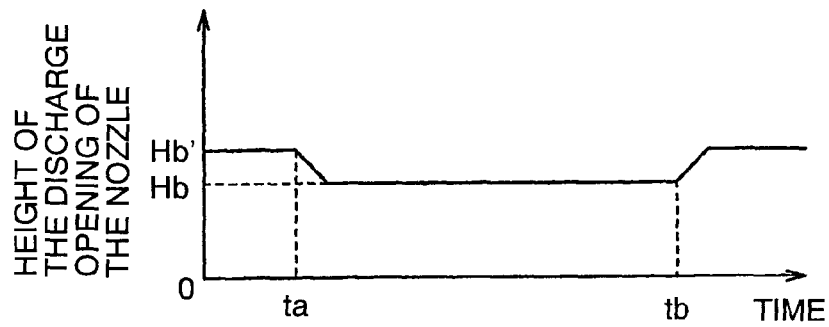
FIG. 32 is a waveform chart of assistance in explaining a variable control method of controlling the height of a resist discharge nozzle to compensate for the variation of the floating height of a substrate at a position directly below the resist discharge nozzle in a preferred embodiment.
Figure 33:
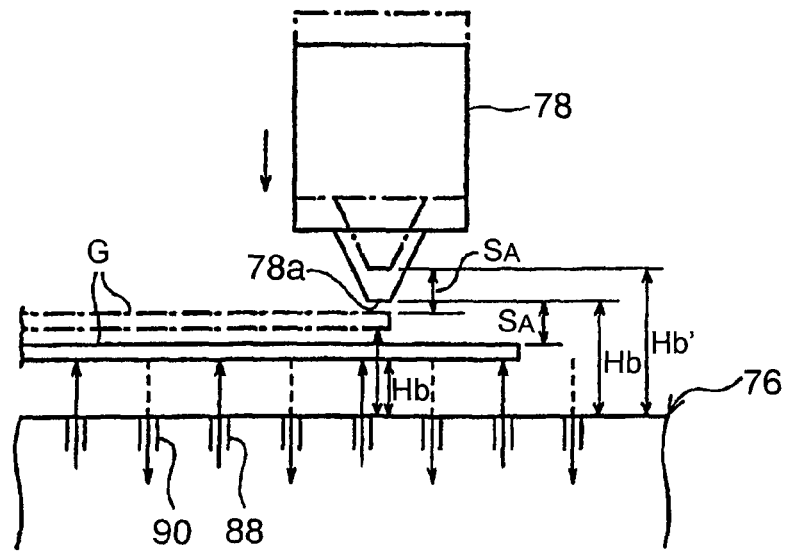
FIG. 33 is schematic side elevation of assistance in explaining a variable control method of controlling the height of a resist discharge nozzle to compensate for the variation of the floating height of a substrate at a position directly below the resist discharge nozzle in a preferred embodiment.

For example, as indicated by a pressure control curve shown in FIG. 31, the compressed air supply system 122 maintains the positive pressure (air jet pressure) at the jet openings 88 constantly at a fixed pressure $P_A$, while the vacuum system 124 controls the negative pressure (suction) at the suction openings 90 according to the position of the substrate G in a variable-pressure control mode. More specifically, the negative pressure at the suction openings 90 is maintained at a second set pressure $-P_v'$ higher in absolute value than a first set pressure $-P_v$ for the coating operation until the front end of the substrate G arrives at the reference position $X_S$ directly below the resist solution discharge nozzle 78. Upon the start of the forward (downstream) movement of the front end of the substrate G at time $t_a$, the negative pressure is increased from the second set pressure $-P_v'$ to the first set pressure $-P_v'$ in a predetermined waveform such that the waveform counterbalance the waveform of variation of the floating height of the substrate G at the position directly below the resist solution discharge nozzle 78. Upon the arrival of the rear end of the substrate G at a predetermined position on the upstream side of the reference position $X_S$ at time $t_b$, the negative pressure is changed from the first set pressure $-p_v$ to the second set pressure $-P_v'$ in a predetermined waveform such that the waveform counterbalances the waveform of variation of the floating height of the substrate G at the position directly below the resist solution discharge nozzle 78.

Otherwise, the vacuum system 124 may maintaining the negative pressure constantly at the set pressure $-P_v$, while the compressed air supply system may control the variation of the discharge pressure according to the position of the substrate G or the compressed air supply system 122 and the vacuum system 124 may operate coordinately to control the respective variations of the positive pressure (jet pressure) and the negative pressure (suction) simultaneously.

Another compensation method may control the nozzle lifting mechanism 75 so as to vary the height of the resist solution discharge nozzle 78 such that the gap between the discharge opening 78a of the resist solution discharge nozzle 78 and the substrate G maintained at the set value $S_A$ from the start of the coating operation instead of correcting the floating height of the substrate G at the position directly below the resist solution discharge nozzle 78. As obvious from a nozzle height control waveform shown in FIG. 32 and a schematic side elevation shown in FIG. 33, the height of the discharge opening 78a of the resist solution discharge nozzle 78 is adjusted to a second set height $H_b'$ higher by a predetermined distance than a first set height $H_b$ allowing for the floating height of the substrate G when the resist solution discharge nozzle 78 is lowered from an upper home position before starting the coating process. The height of the resist solution discharge nozzle 78 is lowered to the first set height $H_b$ in a predetermined waveform to counterbalance or compensate for the decrease of the floating height of the substrate G immediately after the start of the coating process at time $t_a$. The resist solution discharge nozzle 78 is raised to the second set height $H_b{'}$ from predetermined time $t_b$ at the final stage of the coating process according to the increase of the floating height of the substrate G.

The method of correcting the floating height of the substrate G at the position directly below the resist solution discharge nozzle 78 by the compressed air supply system and/or the vacuum system 124 and the method of controlling the variation of the height of the resist solution discharge nozzle 78 by the nozzle lifting mechanism 75 so as to compensate for the variation of the floating height of the substrate G at the position directly below the resist solution discharge nozzle 78 can be applied to the first stage of the present invention (FIG. 24) and the prior art (FIG. 17).

Although the present invention has been described in its preferred embodiment, the present invention is not limited thereto in its practical application and many changes and variations are possible therein without departing from the scope of its technical idea. Particularly, various modifications of the pattern of arrangement of the jet openings 88 and the suction openings 90 and the layout of the slots 88m and 90m in the coating area $M_3$ are possible.

Figure 34:
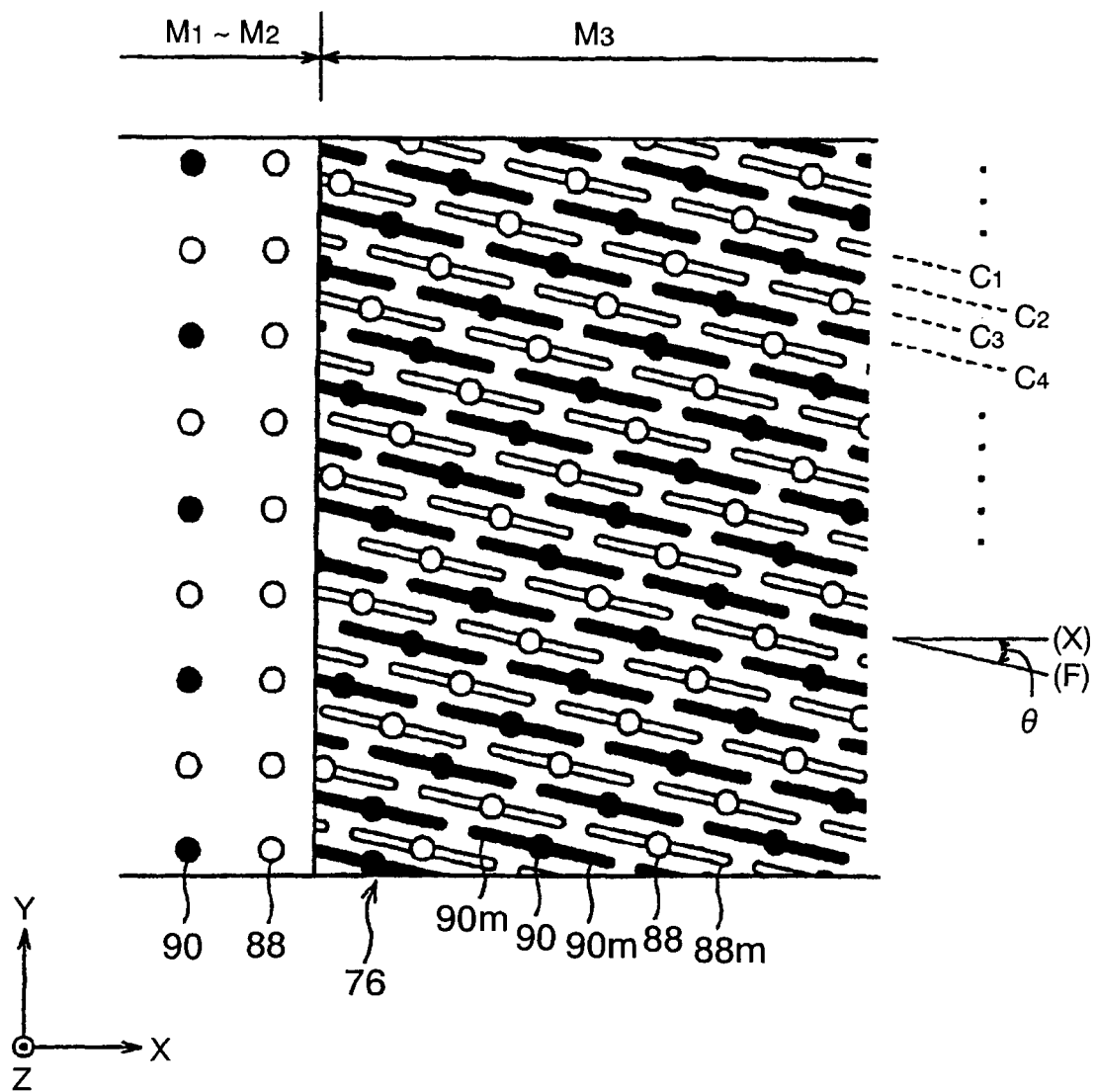
FIG. 34 is a schematic plan view of a pattern of arrangement of jet openings and discharge openings and the layout of slots in a modification in a preferred embodiment.

For example, the jet lines $C_1$, $C_3$, $C_5$, . . . and the suction lines $C_2$, $C_4$, $C_6$, . . . may be extended obliquely at an acute angle $\theta$ to the carrying direction (the X-direction) and arranged alternately as shown in FIG. 34 instead of extending the jet lines $C_1$, $C_3$, $C_5$, . . . and the suction lines $C_2$, $C_4$, $C_6$, . . . parallel to the carrying direction (the X-direction) (FIGS. 6 and 28).

When the jet openings 88 and the suction openings 90 are arranged on oblique lines in such a pattern, the ration $N_A/N_S$, where $N_A$ is the number of the jet openings 88/the suction openings 90 arranged in a straight line in the Y-direction and $N_S$ is the number of the jet openings 88/the suction openings 90 arranged in a line in the Y-direction as viewed from the X-direction can be reduced very low without increasing the density of the jet openings 88/the suction openings 90. Thus, air shocks exerted simultaneously by the plurality of jet openings 88/suction openings 90 on the front and the rear end of the substrate G can be suppressed still more effectively. Moreover, time rates at which parts, particularly parts on lines parallel to the Y-direction of the substrate G face the jet openings 88 and the suction openings 90, respectively, can be equalized. Thus, the formation of traces or marks of the jet openings 88 and the suction openings 90 in the resist solution film RM formed on the substrate G can be prevented.

Figure 35:
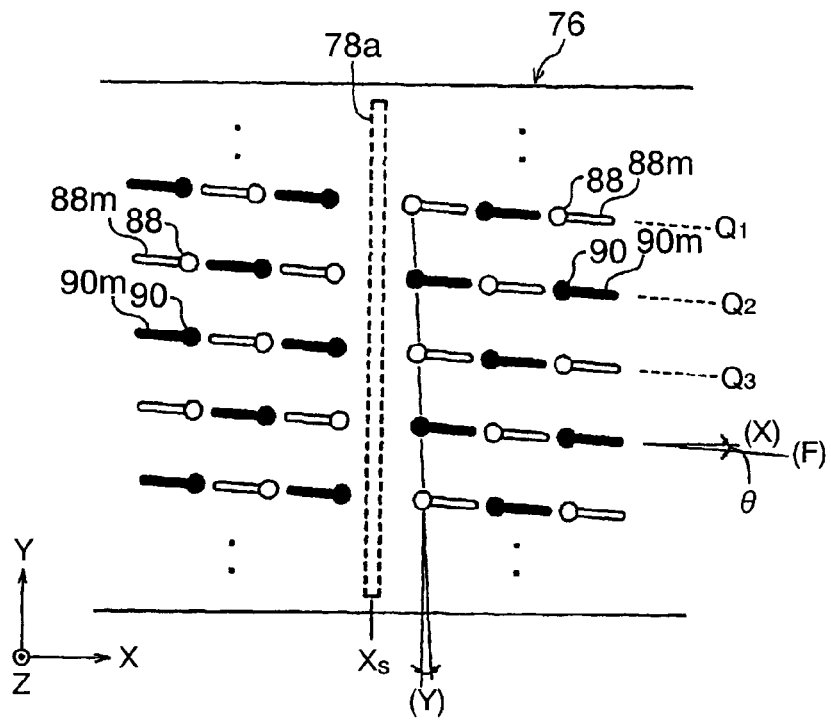
FIG. 35 is a schematic plan view of a pattern of arrangement of jet openings and discharge openings and the layout of slots in another modification in a preferred embodiment.

The slots 88m and 90m may be formed only on one of the opposite sides of the jet openings 88 and the suction openings 90, respectively, as shown in FIG. 35. In this case, it is preferable that the slots 88m and 90m are extended from the jet openings 88 and the suction openings 90 on the upstream side of the reference position $X_S$, respectively, in a direction opposite the carrying direction (the X-direction) to mitigate air shocks on the rear end of the substrate G, and the slots 88m and 90m are extended from the jet openings 88 and the suction openings 90 on the downstream side of the reference position $X_S$, respectively, in the carrying direction (the X-direction) to mitigate air shocks on the front end of the substrate G.

As shown in FIG. 35, the jet openings 88 and the suction openings 90 or sets each of the plurality of jet openings 88 and sets each of the plurality of suction openings 90 may be arranged alternately on parallel jet-and-suction lines $Q_1$, $Q_3$, $Q_5$, . . . parallel to or inclined at an acute angle to the carrying direction (the X-direction).

Although not illustrated, the jet openings 88 and the suction openings 90 combined with the slots 88m and 90m, respectively, may be intermingled with the jet openings 88 and the suction openings 90 not combined with the slots 88m and 90m, respectively, in the coating area $M_3$. For example, only the jet openings 88 not combined with the slots 88m may be arranged in the carrying direction (the X-direction) in a comparatively high density in a line or in a plurality of lines in each of the opposite sides of the coating area $M_3$ to prevent side parts of the substrate G from hanging down.

Although not illustrated, the slots 88m and 90m may be formed in one of various shapes. For example, the thickness (width) of the slots 88m and 90m may change in a longitudinal direction. The adjacent slots on each of the jet or the suction lines may be continuous.

Figure 36:
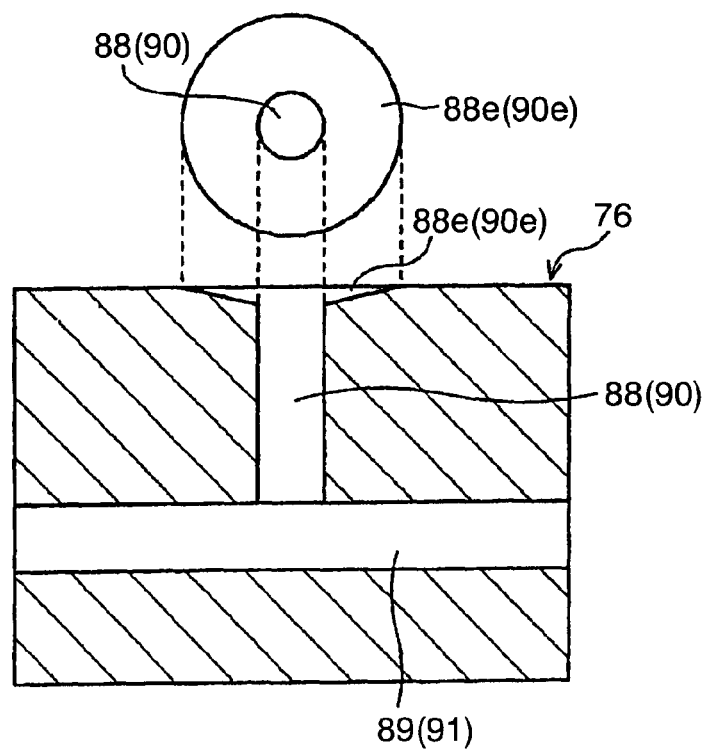
FIG. 36 is a schematic plan view of an annular recess that can be formed round the upper ends of a jet opening and a discharge opening.

FIG. 36 shows a jet opening 88 (a suction opening 90) and an annular recess 88e (90e) surrounding the jet opening 88 (the suction opening 90). Although the annular recess 88e (90e) is not as effective as the slot 88m (90m) of the foregoing embodiment in stabilize the floating height of the substrate G, the annular recess 88e (90e) has a certain improving effect as compared with the jet opening 88 (the suction opening 90) not combined with any slot as shown in FIG. 17.

The present invention can use, as a process liquid, coating liquids other than the resist solution. For example, the process liquid may be a coating liquid of a layer insulating material, a dielectric material or a wiring material, a developer or a rinsing solution. The substrate to be processed by the present invention is not limited to the LCD substrate. The present invention is applicable to processing substrates for flat panel displays other than LCDs, semiconductor wafers, CD substrates, photomasks and printed wiring boards.

The invention claimed is:

1. A coating unit comprising:
a stage having a first flotation area provided with many jet openings for jetting a gas and many suction openings for sucking the gas in an intermixed arrangement;
substrate carrying mechanisms capable of moving a substrate floating above the stage in a predetermined carrying direction past the first flotation area;
a process liquid supply unit including a nozzle disposed above the first flotation area and capable of making the nozzle discharge process liquid onto the substrate; and
slots formed in the first flotation area in an upper surface of the stage so as to extend in a first direction parallel to or inclined at an acute angle to the carrying direction from upper ends of the jet openings or the suction openings,
wherein both slots extending in the carrying direction from the upper ends of the jet or the suction openings and slots extending in a direction opposite the carrying direction from the upper ends of the jet or the suction openings are formed.

2. The coating unit according to claim 1, wherein the slots are extended from all the jet openings and all the suction openings.

3. The coating unit according to claim 1, wherein the jet and the suction openings are arranged alternately at first intervals on straight jet-and-suction lines extending in the first direction, and the jet-and-suction lines are arranged at second intervals in a second direction perpendicular to the first direction.

4. The coating unit according to claim 1, wherein the number of the jet and the suction openings on a straight line extending on the stage in a second direction perpendicular to the first direction is smaller than that of the jet and the suction openings arranged in a line in the second direction perpendicular to the first direction.

5. The coating unit according to claim 1 further comprising:
- a flotation pressure controller for controlling at least either of pressure of the gas jetted through the jet openings and a vacuum in the suction openings for variable height control of a floating height of the substrate at a position directly below a discharge opening of the nozzle.

6. The coating unit according to claim 1, wherein the stage has a second flotation area on the upstream side of the first flotation area with respect to the carrying direction.

7. The coating unit according to claim 1, wherein the stage has a third flotation area on the downstream side of the first flotation area with respect to the carrying direction.

8. A coating unit comprising:
- a stage having a first flotation area provided with many jet openings for jetting a gas and many suction openings for sucking the gas in an intermixed arrangement;
- substrate carrying mechanisms capable of moving a substrate floating above the stage in a predetermined carrying direction past the first flotation area;
- a process liquid supply unit including a nozzle disposed above the first flotation area and capable of making the nozzle discharge process liquid onto the substrate; and
- slots formed in the first flotation area in an upper surface of the stage so as to extend in a first direction parallel to or inclined at an acute angle to the carrying direction from upper ends of the jet openings or the suction openings,
- wherein the slots have the greatest depth at the upper end of the jet or the suction opening and has a bottom sloping up from the upper end of the jet or the suction opening toward a free end thereof.

9. The coating unit according to claim 8, wherein the slots are extended from all the jet openings and all the suction openings.

10. The coating unit according to claim 8, wherein the jet and the suction openings are arranged alternately at first intervals on straight jet-and-suction lines extending in the first direction, and the jet-and-suction lines are arranged at second intervals in a second direction perpendicular to the first direction.

11. The coating unit according to claim 8, wherein the number of the jet and the suction openings on a straight line extending on the stage in a second direction perpendicular to the first direction is smaller than that of the jet and the suction openings arranged in a line in the second direction perpendicular to the first direction.

12. The coating unit according to claim 8 further comprising:
- a flotation pressure controller for controlling at least either of pressure of the gas jetted through the jet openings and a vacuum in the suction openings for variable height control of a floating height of the substrate at a position directly below a discharge opening of the nozzle.

13. The coating unit according to claim 8, wherein the stage has a second flotation area on the upstream side of the first flotation area with respect to the carrying direction.

14. The coating unit according to claim 8, wherein the stage has a third flotation area on the downstream side of the first flotation area with respect to the carrying direction.

15. A coating unit comprising:
- a stage having a first flotation area provided with many jet openings for jetting a gas and many suction openings for sucking the gas in an intermixed arrangement;
- substrate carrying mechanisms capable of moving a substrate floating above the stage in a predetermined carrying direction past the first flotation area;
- a process liquid supply unit including a nozzle disposed above the first flotation area and capable of making the nozzle discharge process liquid onto the substrate; and
- slots formed in the first flotation area in an upper surface of the stage so as to extend in a first direction parallel to or inclined at an acute angle to the carrying direction from upper ends of the jet openings or the suction openings,
- wherein the jet openings are arranged at first intervals on straight jet lines extending in the first direction and arranged at first pitches in a second direction perpendicular to the first direction,
- the suction openings are arranged at second intervals on straight suction lines extending in the first direction and arranged at second pitches in a second direction, and
- the jet lines and the suction lines are separated from each other.

16. The coating unit according to claim 15, wherein the slots are extended from all the jet openings and all the suction openings.

17. The coating unit according to claim 15, wherein the number of the jet and the suction openings on a straight line extending on the stage in the second direction perpendicular to the first direction is smaller than that of the jet and the suction openings arranged in a line in the second direction perpendicular to the first direction.

18. The coating unit according to claim 15 further comprising:
- a flotation pressure controller for controlling at least either of pressure of the gas jetted through the jet openings and a vacuum in the suction openings for variable height control of a floating height of the substrate at a position directly below a discharge opening of the nozzle.

19. The coating unit according to claim 15, wherein the stage has a second flotation area on the upstream side of the first flotation area with respect to the carrying direction.

20. The coating unit according to claim 15, wherein the stage has a third flotation area on the downstream side of the first flotation area with respect to the carrying direction.

* * * * *